United States Patent
Zhang et al.

(10) Patent No.: US 11,309,309 B2
(45) Date of Patent: Apr. 19, 2022

(54) MOTHER SUBSTRATE AND DISPLAY PANEL

(71) Applicants: BOE Technology Group Co., Ltd., Beijing (CN); Hefei Xinsheng Optoelectronics Technology Co., Ltd., Anhui (CN)

(72) Inventors: Han Zhang, Beijing (CN); Haifeng Wang, Beijing (CN); Xingfeng Ren, Beijing (CN); Xin Pan, Beijing (CN); Yanrong Feng, Beijing (CN)

(73) Assignees: BOE Technology Group Co., Ltd., Beijing (CN); Hefei Xinsheng Optoelectronics Technology Co., Ltd., Hefei (CN)

(*) Notice: Subject to any disclaimer, the term of this patent is extended or adjusted under 35 U.S.C. 154(b) by 892 days.

(21) Appl. No.: 16/074,352

(22) PCT Filed: Dec. 18, 2017

(86) PCT No.: PCT/CN2017/116956
§ 371 (c)(1),
(2) Date: Jul. 31, 2018

(87) PCT Pub. No.: WO2018/205626
PCT Pub. Date: Nov. 15, 2018

(65) Prior Publication Data
US 2021/0210482 A1    Jul. 8, 2021

(30) Foreign Application Priority Data
May 10, 2017   (CN) .......................... 201710326287.0

(51) Int. Cl.
*H01L 27/02* (2006.01)
*H01L 27/12* (2006.01)
(Continued)

(52) U.S. Cl.
CPC ........ *H01L 27/0296* (2013.01); *H01L 27/027* (2013.01); *H01L 27/0255* (2013.01);
(Continued)

(58) Field of Classification Search
CPC ............. H01L 27/0296; H01L 27/0255; H01L 27/0292; H01L 27/1244; H01L 27/027;
(Continued)

(56) References Cited

U.S. PATENT DOCUMENTS 8,529,307 B1   9/2013  Chen
9,501,959 B2   11/2016  Kim et al.
(Continued)

FOREIGN PATENT DOCUMENTS

CN    101038300 A    9/2007
CN    102789076 A    11/2012
(Continued)

OTHER PUBLICATIONS

Mar. 14, 2018—(WO) International Search Report and Written Opinion Appn PCT/CN2017/116956 with English Translation.

*Primary Examiner* — Ermias T Woldegeorgis
(74) *Attorney, Agent, or Firm* — Banner & Witcoff, Ltd.

(57) ABSTRACT

A mother substrate and a display panel are disclosed. The mother substrate includes a plurality of display panels, a plurality of first test terminals and a plurality of first one-way conductive circuits. Each of the display panels has a display area, and includes a plurality of first signal lines extending from outside of the display area to the display area in parallel; the plurality of first signal lines of each of the display panels are respectively electrically connected to one of the plurality of first test terminals; the plurality of first one-way conductive circuits are respectively electrically connected to the plurality of first signal lines outside the display area and are configured to allow signals to be able to (Continued)

transmit only from the plurality of first test terminals to the plurality of first signal lines of each of the display panels.

18 Claims, 15 Drawing Sheets

(51) Int. Cl.
    *G02F 1/1333*     (2006.01)
    *G02F 1/1362*     (2006.01)
    *G02F 1/1345*     (2006.01)
    *G02F 1/13*     (2006.01)

(52) U.S. Cl.
    CPC ...... *H01L 27/0292* (2013.01); *H01L 27/1244* (2013.01); *G02F 1/1309* (2013.01); *G02F 1/13452* (2013.01); *G02F 1/133351* (2013.01); *G02F 1/136204* (2013.01)

(58) Field of Classification Search
    CPC ......... G02F 1/136204; G02F 1/136254; G02F 1/1309; G02F 1/133351; G02F 1/13452; G09G 3/006; G09G 3/3648; G09G 2300/0408; G09G 2300/0426
    See application file for complete search history.

(56) References Cited

U.S. PATENT DOCUMENTS

| | | | |
|---|---|---|---|
| 2008/0265250 A1* | 10/2008 | Huang | G02F 1/136204 |
| | | | 257/48 |
| 2009/0311824 A1 | 12/2009 | Shin et al. | |
| 2017/0352594 A1 | 12/2017 | Choi et al. | |
| 2018/0069030 A1 | 3/2018 | Zhang et al. | |

FOREIGN PATENT DOCUMENTS

| | | |
|---|---|---|
| CN | 104464580 A | 3/2015 |
| CN | 105489613 A | 4/2016 |
| CN | 106405889 A | 2/2017 |

* cited by examiner

MOTHER SUBSTRATE AND DISPLAY PANEL

The application is a U.S. National Phase Entry of International Application No. PCT/CN2017/116956 filed on Dec. 18, 2017, designating the United States of America and claiming priority to Chinese Patent Application No. 201710326287.0, filed on May 10, 2017. The present application claims priority to and the benefit of the above-identified applications and the above-identified applications are incorporated by reference herein in their entirety.

TECHNICAL FIELD

Embodiments of the present disclosure relate to a mother substrate and a display panel.

BACKGROUND

Liquid crystal display devices have been favored by consumers because of characteristics such as low power consumption, and have become a mainstream trend in the development of the display field. A plurality of manufacturing processes (such as transportation, cleaning, stripping, rubbing, and the like) for a liquid crystal display device can accumulate a large amount of static charges on a mother substrate used to fabricate the display device, and thus static electricity discharge can be occurred in the case that the amount of the static charges accumulated is larger than a certain threshold. Static electricity discharge brings about a great damage to the display device, for example, a short circuit can be occurred between adjacent gate lines or adjacent data lines, and thus display defects are caused. Therefore, before cutting the mother substrate to obtain independent display panels, it is necessary to test the display panels included in the mother substrate to locate the display panel with the defect caused by static electricity discharge.

SUMMARY

An embodiment of present disclosure provide a mother substrate, the mother substrate comprises a plurality of display panels, a plurality of first test terminals, and a plurality of first one-way conductive circuits. Each of the display panels has a display area, and each of the display panels comprises a plurality of first signal lines extending from outside of the display area to the display area in parallel; the plurality of first signal lines of each of the display panels are respectively electrically connected to one of the plurality of first test terminals; the plurality of first one-way conductive circuits are respectively electrically connected to the plurality of first signal lines outside the display area, and are configured to allow signals to be able to transmit only from the plurality of first test terminals to the plurality of first signal lines of each of the display panels.

For example, in the mother substrate provided by an embodiment of present disclosure, the mother substrate further comprises a cutting area. The first test terminals are provided in the cutting area, the plurality of first signal lines of each of the display panels are respectively electrically connected to the one of the plurality of first test terminals in the cutting area.

For example, in the mother substrate provided by an embodiment of present disclosure, the plurality of first one-way conductive circuits are provided in the cutting area.

For example, in the mother substrate provided by an embodiment of present disclosure, the mother substrate further comprises a plurality of first test bus lines. The plurality of first test bus lines are electrically connected to the plurality of first test terminals; each of the first one-way conductive circuits is electrically connected to one of the plurality of first test bus lines, such that the plurality of first signal lines of each of the display panels are respectively electrically connected to the one of the plurality of first test terminals.

For example, in the mother substrate provided by an embodiment of present disclosure, each of the first one-way conductive circuit comprises a first terminal and a second terminal. The first terminal is electrically connected to corresponding one of the first signal lines; the second terminal is electrically connected to corresponding one of the first test bus lines; and a conducting direction of each of the first one-way conductive circuits is a direction from the second terminal to the first terminal, such that the signals are only allowed to be transmitted from the plurality of first test terminals to the plurality of first signal lines of each of the display panels.

For example, in the mother substrate provided by an embodiment of present disclosure, at least two adjacent first signal lines are electrically connected to different first test terminals via corresponding first one-way conductive circuits.

For example, in the mother substrate provided by an embodiment of present disclosure, the mother substrate comprises at least two first test terminals electrically connected to the first signal lines of each of the display panels, one of the at least two first test terminals is electrically connected to the first signal lines in odd-numbered rows of each of the display panels, and another first test terminal of the at least two first test terminals is electrically connected to the first signal lines in even-numbered rows of each of the display panels.

For example, in the mother substrate provided by an embodiment of present disclosure, the first one-way conductive circuit comprises a diode or a transistor, a gate electrode of the transistor is electrically connected to a source electrode or a drain electrode of the transistor.

For example, in the mother substrate provided by an embodiment of present disclosure, the mother substrate further comprises a plurality of second test terminals and a plurality of second one-way conductive circuits. Each of the display panels further comprises a plurality of second signal lines extending from the outside of the display area to the display area in parallel, in which the plurality of second signal lines intersect with the plurality of first signal lines; the plurality of second signal lines of each of the display panels are respectively electrically connected to one of the plurality of second test terminals; the plurality of second one-way conductive circuits are respectively electrically connected to the plurality of second signal lines outside the display area, and are configured to allow signals to be able to transmit only from the plurality of second test terminals to the plurality of second signal lines of each of the display panels.

For example, in the mother substrate provided by an embodiment of present disclosure, the mother substrate further comprises a plurality of second test bus lines. The plurality of second test bus lines are electrically connected to the plurality of second test terminals, each of the second one-way conductive circuits is electrically connected to one of the plurality of second test bus lines, such that the plurality of second signal lines of each of the display panels are respectively electrically connected to the one of the plurality of second test terminals.

For example, in the mother substrate provided by an embodiment of present disclosure, at least two adjacent second signal lines are electrically connected to different second test terminals via corresponding second one-way conductive circuits.

For example, in the mother substrate provided by an embodiment of present disclosure, the first one-way conductive circuit comprises a first conductive layer, a first insulation layer, an active layer, a second insulation layer and a second conductive layer sequentially provided; the first conductive layer comprises a first sub-region and a second sub-region which are insulated from each other; the second conductive layer comprises a first connection electrode and a second connection electrode which are insulated from each other, one end of the first connection electrode and one end of the second connection electrode are electrically connected to the first sub-region and the second sub-region respectively via through holes in the first insulation layer and the second insulation layer, another end of the first connection electrode and another end of the second connection electrode are respectively electrically connected to the active layer.

For example, in the mother substrate provided by an embodiment of present disclosure, the first one-way conductive circuit further comprises a third conductive layer; the third conductive layer is provided between the first insulation layer and the second insulation layer; the third conductive layer comprises a first intermediate electrode and a second intermediate electrode; one end of the first intermediate electrode and one end of the second intermediate electrode are respectively electrically connected to the first connection electrode and the second connection electrode via through holes in the second insulation layer; another end of the first intermediate electrode and another end of the second intermediate electrode are respectively electrically connected to the active layer.

For example, in the mother substrate provided by an embodiment of present disclosure, each of the display panels comprises a thin film transistor. The first conductive layer and a gate electrode of the thin film transistor are in same one layer; the first insulation layer and a gate insulation layer of the thin film transistor are in same one layer; the active layer and a semiconductor layer of the thin film transistor are in same one layer; the second insulation layer and a passivation layer of the thin film transistor are in same one layer; the second conductive layer and a pixel electrode or a common electrode of the display panel are in same one layer; the third conductive layer and a source electrode and a drain electrode of the thin film transistor are in same one layer.

For example, in the mother substrate provided by an embodiment of present disclosure, an orthographic projection of the first sub-region on the mother substrate and an orthographic projection of the active layer on the mother substrate are at least partially overlapped with each other; an orthographic projection of the second sub-region on the mother substrate and the orthographic projection of the active layer on the mother substrate are not overlapped with each other.

For example, in the mother substrate provided by an embodiment of present disclosure, each of the display panels further comprises a plurality of antistatic circuits and an electrostatic release line. The plurality of antistatic circuits are respectively provided between and electrically connected to the plurality of first signal lines and the electrostatic release line outside the display area, and are respectively provided between and electrically connected to the first terminals of the plurality of first one-way conductive circuits and the electrostatic release line.

For example, in the mother substrate provided by an embodiment of present disclosure, each of the display panels further comprises a plurality of antistatic circuits, each of the antistatic circuits is provided between adjacent two first signal lines, and is provided between the first terminals of two first one-way conductive circuits electrically connected to the adjacent two first signal lines.

Another embodiment of present disclosure provide a display panel including a display area, the display panel comprises: a plurality of first signal lines and a plurality of first one-way conductive circuits. The plurality of first signal lines extend from outside of the display area to the display area in parallel; the plurality of first one-way conductive circuits are respectively electrically connected to the plurality of first signal lines outside the display area, and are configured to allow signals in each of the first signal lines to be capable of transmitting toward only one direction.

For example, in the display panel provided by another embodiment of present disclosure, the display panel further comprises: a plurality of second signal lines being intersected with the plurality of first signal lines, and a plurality of second one-way conductive circuits. The plurality of second signal lines extend from the outside of the display area to the display area in parallel; the plurality of second one-way conductive circuits are respectively electrically connected to the plurality of second signal lines outside the display area, and are configured to allow signals in each of the second signal lines to be capable of transmitting toward only one direction.

Further another embodiment of present disclosure provides a test method for the mother substrate, the test method for the mother substrate comprises: applying test signals into the first signal lines of each of the display panels via corresponding first one-way conductive circuits with the plurality of first test terminals, and performing determination based on display situations of the plurality of display panels.

For example, in the test method for the mother substrate provided by another embodiment of present disclosure, the test signals are sequentially applied into first signal lines in odd-numbered rows of each of the display panels and first signal lines in even-numbered rows of each of the display panels via corresponding first one-way conductive circuits with the plurality of first test terminals, and then determination are performed based on the display situations of the plurality of display panels.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
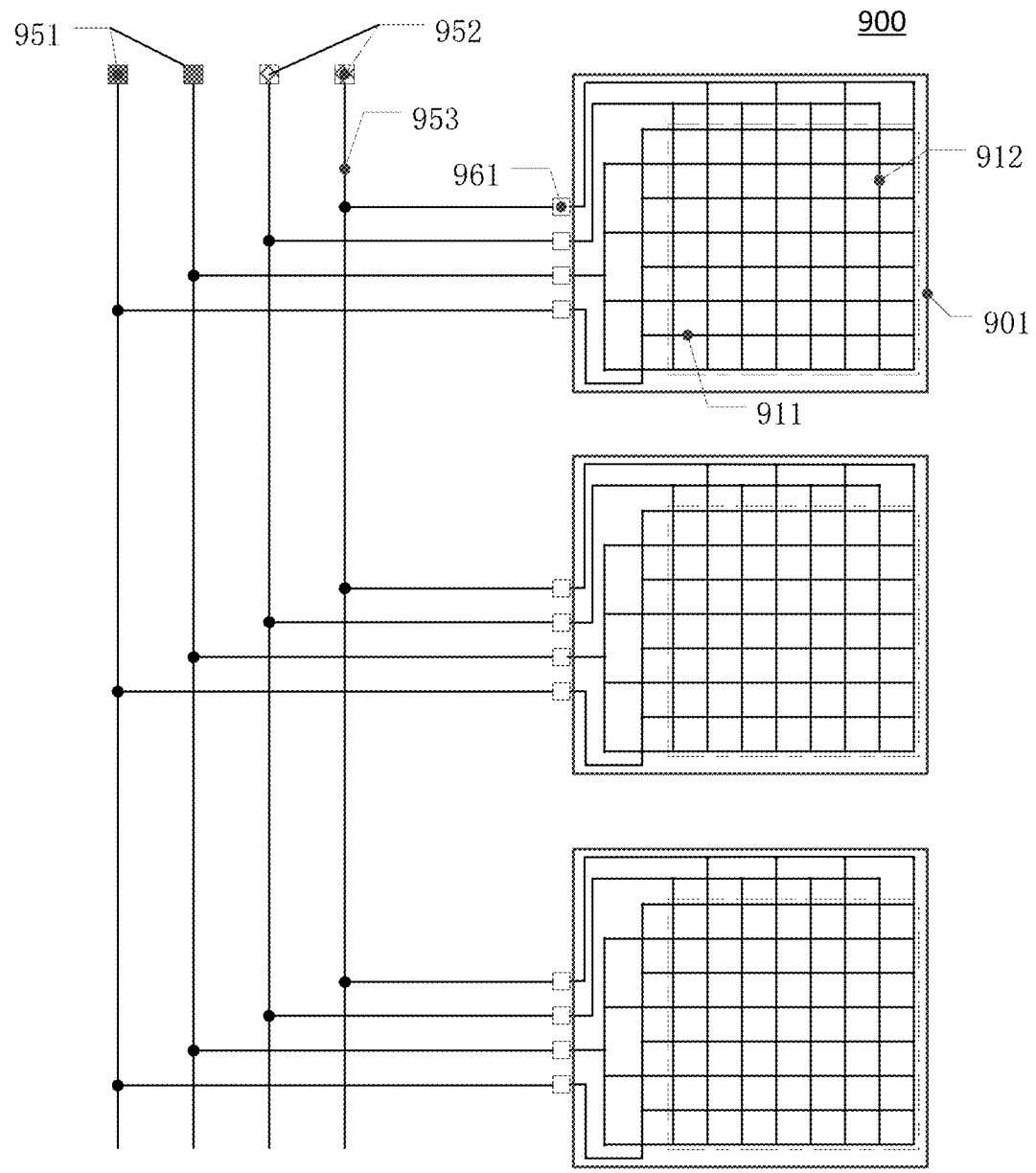
FIG. 1A is a schematic diagram of a mother substrate.

FIG. 1A is a schematic diagram of a mother substrate 900, the mother substrate 900 as illustrated in FIG. 1A comprises a plurality of display panels 901, a plurality of test terminals (for example, as illustrated in figures, two first test terminals 951 and two second test terminals 952), a plurality of pads 961, and a plurality of test bus lines 953. Each display panel 901 comprises a plurality of gate lines 911 and a plurality of data lines 912; the gate lines 911 in odd-numbered rows are electrically connected to one first test terminal 951 respectively via a corresponding pad 961, and the gate lines 911 in even-numbered rows are electrically connected to another first test terminal 951 respectively via a corresponding pad 961; the data lines 912 in odd-numbered columns are electrically connected to one second test terminal 952 respectively via a corresponding pad 961, and the data lines 912 in even-numbered columns are electrically connected to another second test terminal 952 respectively via a corresponding pad 961.

Figure 1B:
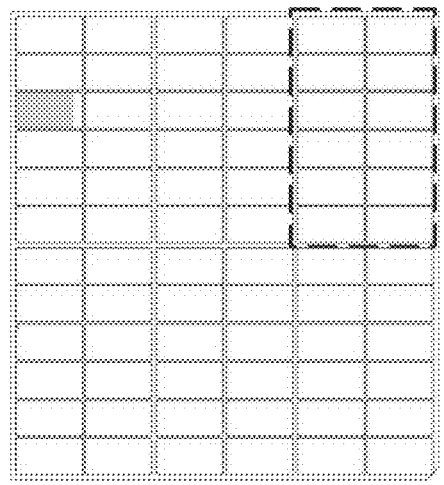
FIG. 1B is a diagram, outputted by an instrument, illustrating a test result of a mother substrate.

The inventors note that current test method (for the defect caused by static electricity discharge) of the mother substrate 900 can determine whether the defect caused by static electricity discharge exists in the mother substrate 900 or not through sequentially testing the resistance value between the test terminals corresponding to the gate lines (the first test terminal 951) and testing the resistance value between the test terminals corresponding to the data lines (the second test terminal 952), and based on the determination result regarding whether the resistance value is decreased or not (for example, it is determined that the defect exists in the case that the resistance value is decreased). FIG. 1B is a diagram, outputted by an instrument, illustrating a test result of a mother substrate 900, in which each rectangular frame represents one display panel 901, and the region in dashed frame in FIG. 1B represents that the defect caused by static electricity discharge exists in at least one of the above-mentioned display panels 901. However, the above-mentioned method and instrument cannot determine that the defect caused by static electricity discharge exists in how many of the display panels 901, let alone locate which one or more of the display panels 901 suffer from the defect caused by static electricity discharge. Detailed reasons are given in the following.

Figure 1C:
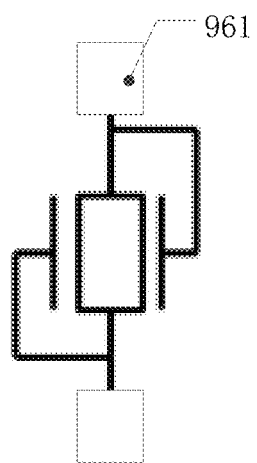
FIG. 1C is an arrangement of an electrostatic ring.

For the test method of the mother substrate 900 based on the resistance value, it is determined that the defect caused by static electricity discharge (for example, short circuit) exists between wires connected to the two test terminals 951 in the cast that the resistance value between the two test terminals 951 (for example, the resistance value between two first test terminals 951 at the left portion of FIG. 1A) is decreased; for example, the above-mentioned defect caused by static electricity discharge can exist between two adjacent gate lines 911 of the display panel 901. For another example, as illustrated in FIG. 1C, in the case that an electrostatic ring is provided between two adjacent pads 961, the above-mentioned short circuit caused by static electricity discharge can also be the short circuit, which is caused by electrostatic breakdown of the electrostatic ring and between adjacent pads 961. Because the plurality of display panels 901 are electrically connected to the two first test terminals 951 during the test, the display panels 901, having experienced static electricity discharge, in the mother substrate 900 cannot be located. Therefore, in the case that it is determined that the defect caused by static electricity discharge exists in the mother substrate 900, manual testing is needed for all the display panels 901 in the mother substrate 900, so as to locate the display panel 901 with the defect caused by static electricity discharge. However, the manual testing is not only time-consuming and labor-intensive, but also has issues such as missed detection.

The inventors also note that, for the current mother substrate structure, the display panel 901, having experienced static electricity discharge, in the mother substrate 900 cannot be located through observation on the display situation of each display panel 901 after signals being applied onto the first test terminal 951 or/and the second test terminal 952, and detailed reasons are given in the following.

Figure 2A:
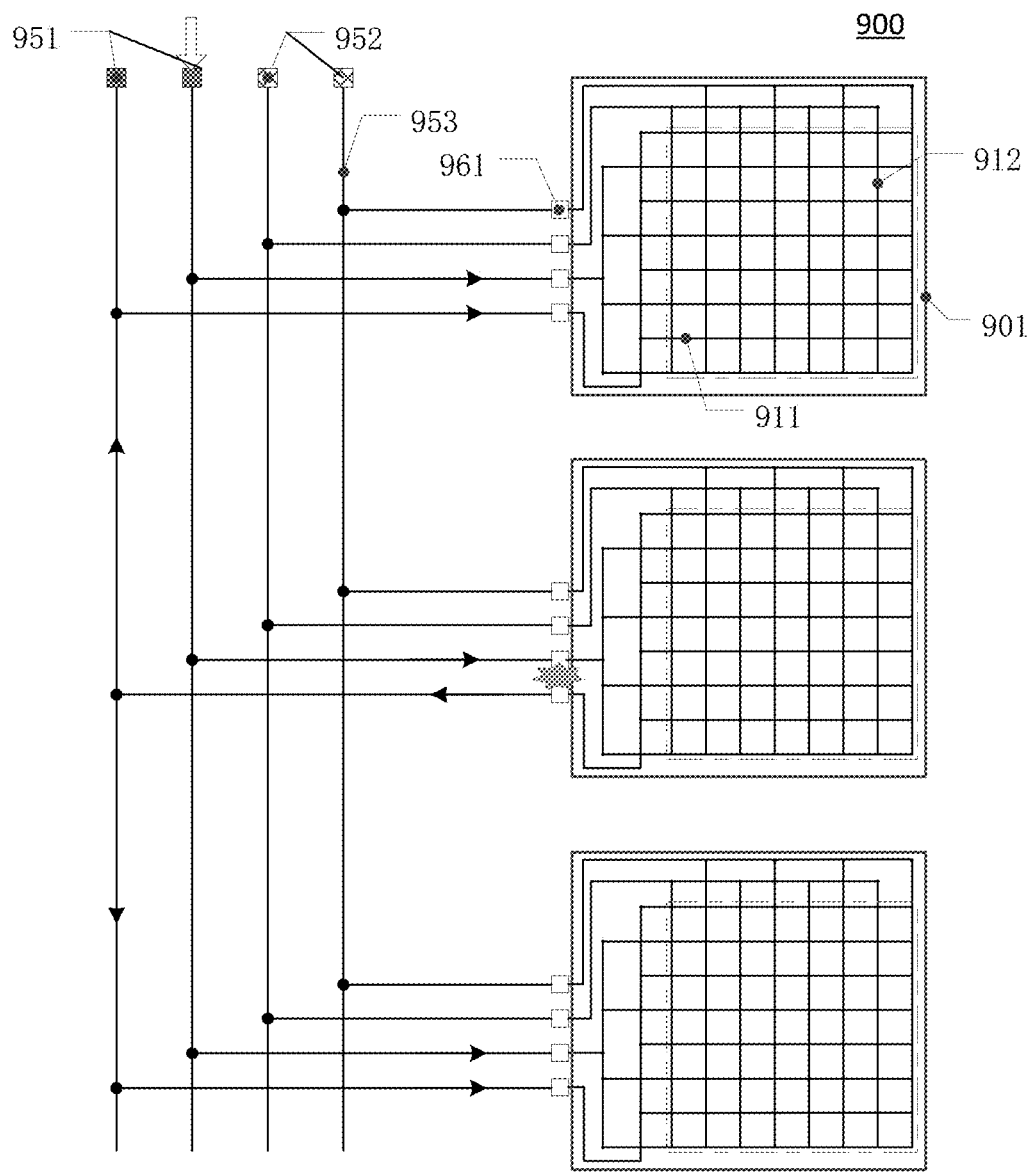
FIG. 2A is a schematic diagram illustrating a method to detect a kind of defect of the mother substrate as illustrated in FIG. 1A.

For example, as illustrated in FIG. 2A, in the case that no static electricity discharge occurs in the display panels 901, for each display panel 901, only the pixels in even-numbered rows are driven to operate (to be lit up), and pixels in odd-numbered rows are not driven to operate, after the scan signals are applied onto the first test terminal 951 located at the second position from the left and the data signals are applied onto the second test terminals 952 located at the third and fourth position from the left.

For example, as illustrated in FIG. 2A, in the case that the electrostatic rings are provided between two adjacent pads, and the static electricity discharge occurs on the electrostatic ring provided between two pads, which correspond to two first test terminals 951, of the display panel 901 located at the middle position, the electric signals not only can transmit to the gate lines 911 in even-numbered rows of the display panel 901 located at the middle position via the electrostatic ring having experienced electrostatic breakdown, but also can transmit to the test bus line corresponding to the leftmost first test terminal 951 via the electrostatic ring having experienced electrostatic breakdown, and then transmit to the gate lines 911 in odd-numbered rows of the display panels 901 at upper position and lower position. Therefore, display abnormality occurs in all the display panels 901 of the mother substrate 900, and thus the above-mentioned method cannot locate the display panel 901, having experienced electrostatic breakdown, in the mother substrate 900.

Figure 2B:
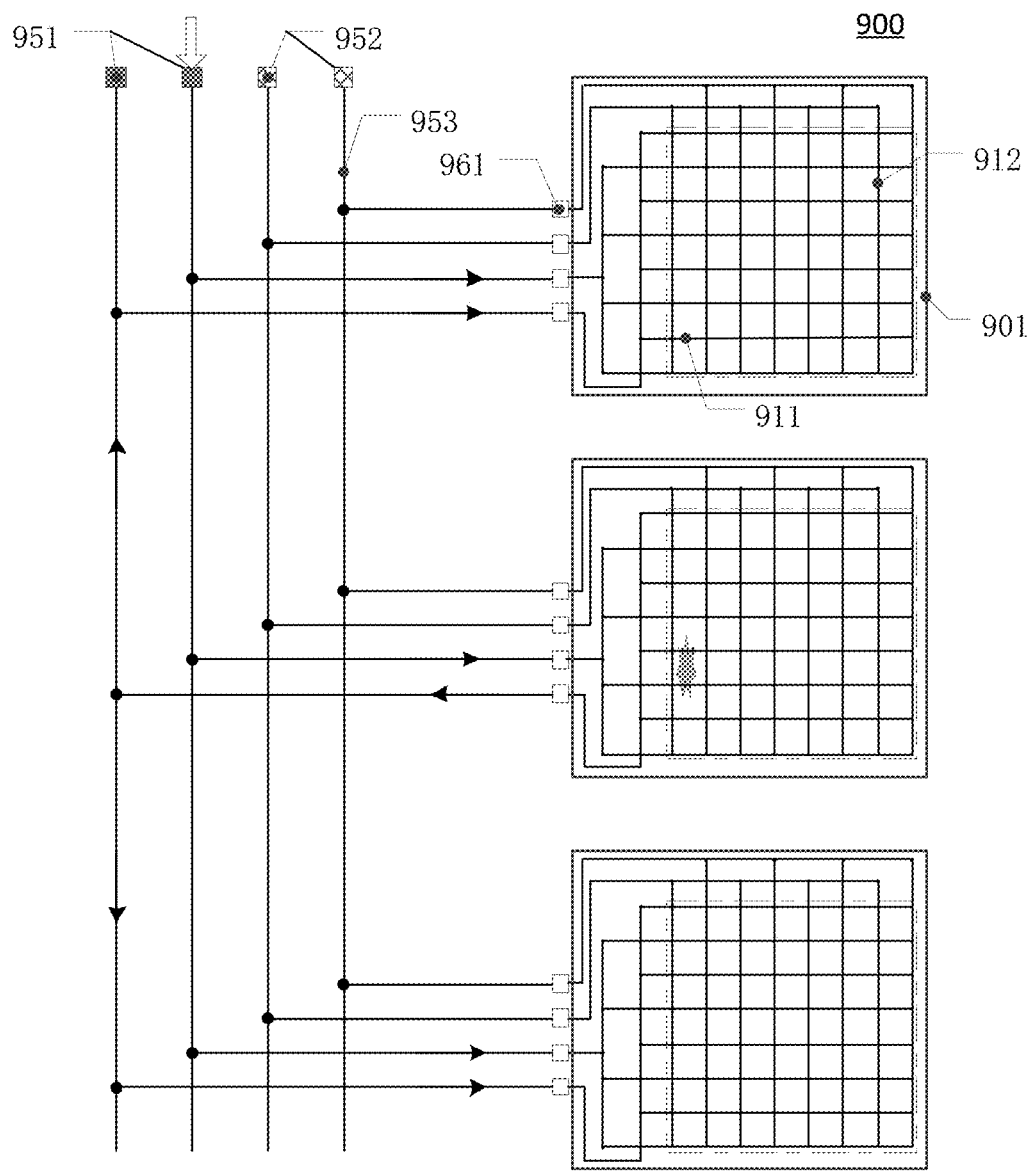
FIG. 2B is a schematic diagram illustrating a method to detect another kind of defect of the mother substrate as illustrated in FIG. 1A.
Figure 2C:
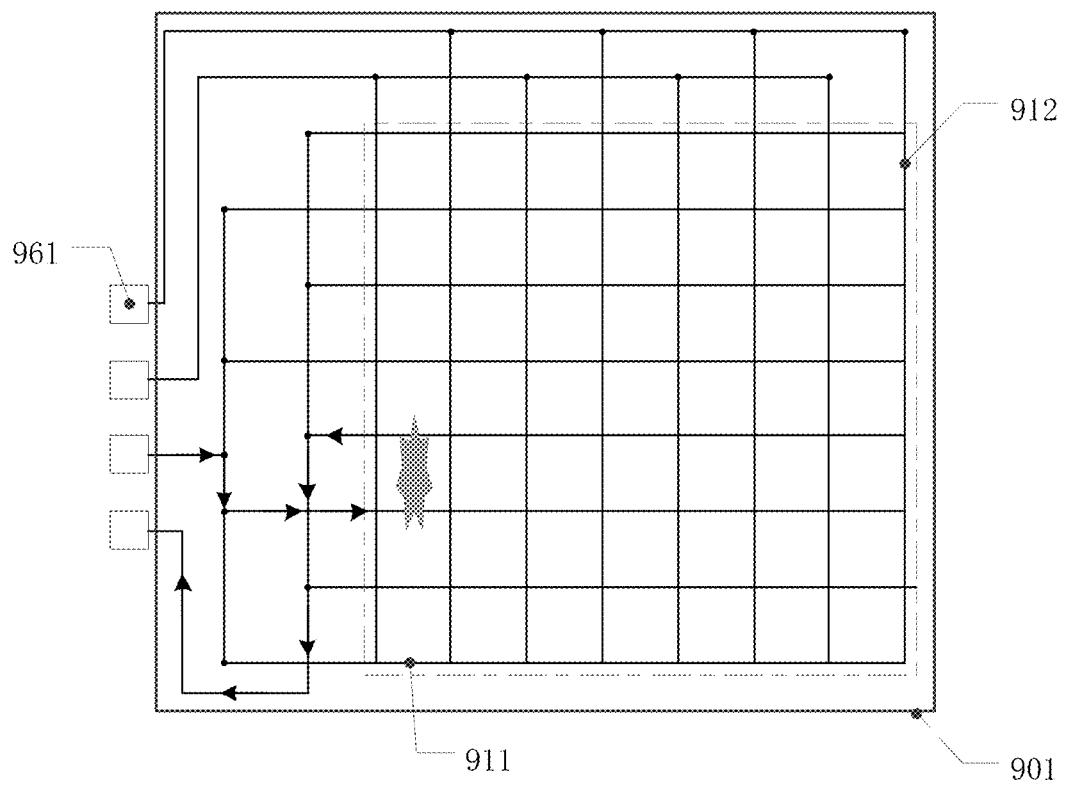
FIG. 2C is a schematic diagram illustrating local current flow directions during testing another kind of defect of the mother substrate as illustrated in FIG. 1A.

For example, as illustrated in FIG. 2B and FIG. 2C, in the case that the short circuit occurs between adjacent two gate lines 911 of the display panel 901 located at the middle position, the scan signals that are applied into the gate lines 911 in even-numbered rows via the first test terminal 951 located at the second position from the left are transmitted to the gate lines 911 in odd-numbered rows, which are adjacent to the gate lines 911 in even-numbered rows, via the position with the short circuit occurring, and transmit to the test bus line corresponding to the leftmost first test terminal 951 via a corresponding pad, and eventually transmit to the gate lines 911 in odd-numbered rows of the display panels 901 at upper position and lower position. Therefore, display abnormality occurs in all the display panels 901 of the mother substrate 900, and thus the above-mentioned method cannot locate the display panel 901, having experienced electrostatic breakdown, in the mother substrate 900.

Embodiments of present application provide a mother substrate and a test method for the mother substrate, and the mother substrate and the test method for the mother substrate can locate a display panel or display panels, with the defect caused by static electricity discharge, in the mother substrate.

At least one embodiment of present disclosure provide a mother substrate, the mother substrate comprises a plurality of display panels, a plurality of first test terminals, and a plurality of first one-way conductive circuits. Each display panel has a display area, and each display panel comprises a plurality of first signal lines extending from outside of the display area to the display area in parallel; the plurality of first signal lines of each display panel are respectively electrically connected to one of the plurality of first test terminals; the plurality of first one-way conductive circuits are respectively electrically connected to the plurality of first signal lines at outside of the display area, and are configured to allow signals to be able to transmit only from the plurality of first test terminals to the plurality of first signal lines of each display panel. For example, the display area of the display panel can comprise a sub-pixel array, and the sub-pixel array is configured to display images during operation; for another example, peripheral circuits, such as a driver circuit, an antistatic circuit, and the like, can be provided outside the display area.

Figure 3A:
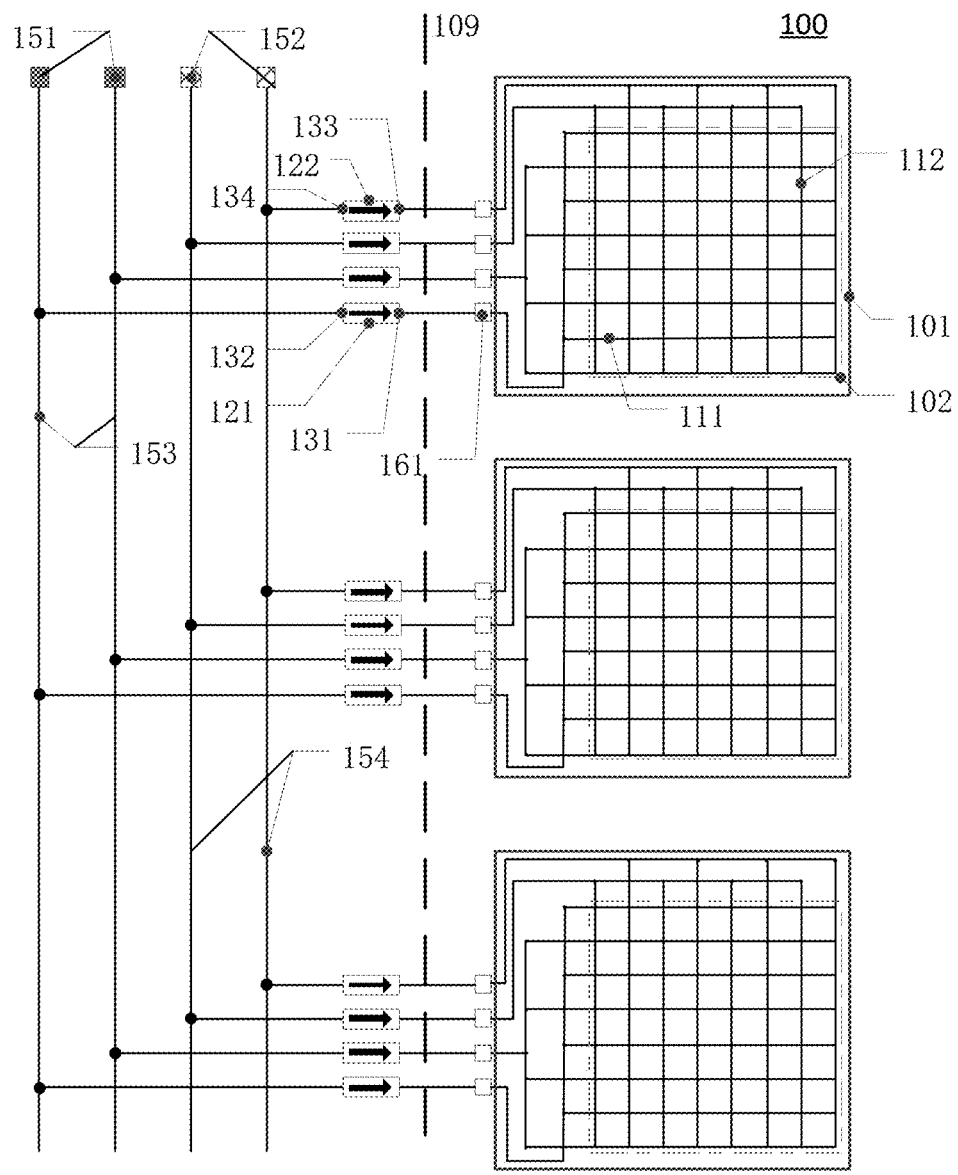
FIG. 3A is a schematic diagram of a mother substrate provided by an embodiment of present disclosure.

For example, FIG. 3A is a schematic diagram of a mother substrate 100 provided by an embodiment of present disclosure. For example, as illustrated in FIG. 3A, the mother substrate 100 comprises a plurality of display panels 101, a plurality of first test terminals 151 and a plurality of first one-way conductive circuits 121. For example, the mother substrate 100 can also comprise a plurality of test bus lines (for example, a first test bus line 153 and a second test bus line 154).

For example, the mother substrate 100 can also comprise a cutting area. For example, the cutting area is a region that is cut out after test of the mother substrate is finished, and thus independent display panels 101 can be obtained. For example, the shape and size of the cutting area can be set according to specific implementation demands, and no limitations are given in the embodiments of present application in this aspect. For example, the cutting area can be a region on the left of a cutting line 109, but the embodiments of present application are not limited thereto. For example, the first test terminal 151 and the first one-way conductive circuit 121 can be provided in the cutting area.

For example, to clearly illustrate the embodiments of present application, the mother substrate 100 in FIG. 3A and the related accompany drawing illustratively comprises three display panels 101, but the embodiments of present application are not limited thereto. For example, according to process conditions and specific implementation demands, each mother substrate 100 can comprise nine or eighteen display panels 101.

For example, as illustrated in FIG. 3A, each display panel 101 has a display area 102, and each display panel 101 comprises a plurality of first signal lines 111 and a plurality of second signal lines 112, and these first and second signal lines extend from outside of the display area 102 to the display area 102 in parallel. For example, the plurality of first signal lines 111 can be intersected with (for example, perpendicular to) the plurality of second signal lines 112. For example, the first signal lines 111 can be gate lines, while the second signal lines 112 can be data lines; for another example, the first signal lines 111 can be data lines, while the second signal lines 112 can be gate lines. For example, the embodiments of present application are described in detail by taking the case that the first signal lines 111 are the gate lines and the second signal lines 112 are the data lines as an example, but the embodiments of present application are not limited thereto. For example, in order to clearly illustrate the embodiments of present application, the embodiments of present application exemplarily illustrates that the display panel 101 comprise eight first signal lines 111 and eight second signal lines 112, but the embodiments of present application are not limited thereto. For example, according to specific implementation demands, each display panel 101 can comprise 900 first signal lines 111 and 1440 second signal lines 112.

For example, the plurality of first signal lines 111 of each display panel 101 can be respectively electrically connected to one of the plurality of first test terminals 151 (for example, can be respectively electrically connected to one of the plurality of first test terminals 151 in the cutting area). For example, the number of the first test terminals 151, and electrical connections between the first signal lines 111 and the first test terminals 151 can be chosen according to specific implementation demands, and no limitations are given in the embodiments of present application in this aspect. For example, the number of the first test terminals 151, and the electrical connections between the first signal lines 111 and the first test terminals 151 can be set to satisfy the following condition, that is, at least two adjacent first signal lines 111 are electrically connected to different first test terminals 151 via corresponding first one-way conductive circuits 121 respectively.

Figure 4A:
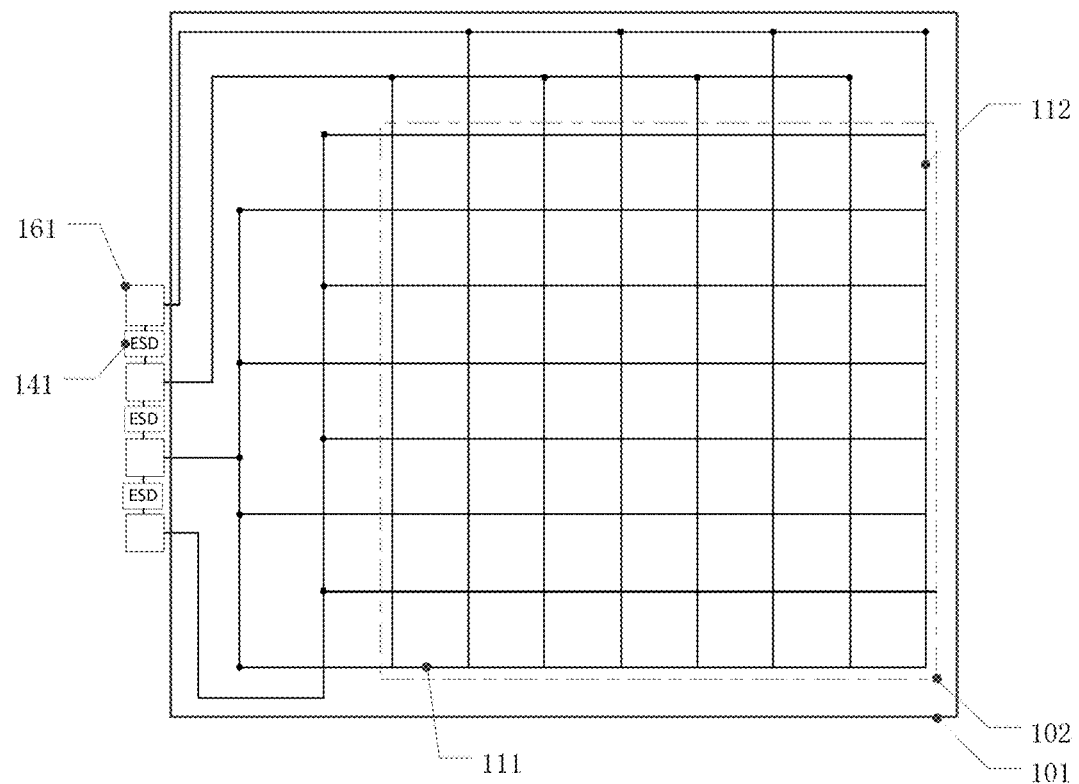
FIG. 4A is a diagram illustrating a method to set an antistatic circuit in the mother substrate as illustrated in FIG. 3A.

For example, as illustrated in FIG. 3A and FIG. 4A, the mother substrate 100 can comprise two first test terminals 151, which are electrically connected to the first signal lines 111 of each display panel 101; one first test terminal 151 (for example, the leftmost first test terminal 151) is electrically connected to the first signal lines 111 in odd-numbered rows of each display panel 101, and another first test terminal 151 (for example, the first test terminal 151 located at the second position from the left to right) is electrically connected to the first signal lines 111 in even-numbered rows of each display panel 101.

For example, the plurality of first one-way conductive circuits 121 can be respectively electrically connected to the plurality of first signal lines 111 outside the display area 102 and are configured to allow signals to be able to transmit only from the plurality of first test terminals 151 to the plurality of first signal lines 111 of each display panel 101. For example, the plurality of first test bus lines 153 can be electrically connected to the plurality of first test terminals 151 (for example, each first test bus line 153 can be electrically connected to one first test terminal 151), and each first one-way conductive circuit 121 can be electrically connected to one of the plurality of first test bus lines 153, such that the plurality of first signal lines 111 of each display panel 101 are respectively electrically connected to one of the plurality of first test terminals 151. For example, each first one-way conductive circuit 121 can comprise a first terminal 131 and a second terminal 132, and the conducting direction of each first one-way conductive circuit 121 is the direction from the second terminal 132 to the first terminal 131; the first terminal 131 can be electrically connected to a corresponding first signal line 111, and the second terminal 132 can be electrically connected to a corresponding first test bus line 153, such that the signals can only be transmitted from the plurality of first test terminals 151 to the plurality of first signal lines 111 of each display panel 101.

For example, as illustrated in FIG. 3A and FIG. 4A, the mother substrate 100 can comprise two first one-way conductive circuits 121. For example, in the mother substrate 100, both the number of the first test bus lines 153 corresponding to the first one-way conductive circuits 121 and the number of the first test terminals 151 can be equal to the number of the first one-way conductive circuits 121. For example, in the case that the mother substrate 100 comprises two first one-way conductive circuits 121, the mother substrate 100 can comprise two first test terminals 151 and two first test bus line 153 corresponding to the first test terminals 151.

For example, in the plurality of one-way conductive circuits (for example, four rows of one-way conductive circuits) corresponding to each display panel 101, the first terminal 131 of one first one-way conductive circuit 121 (for example, the first one-way conductive circuit 121 located at the fourth row) can be electrically connected to the first signal lines 111 in odd-numbered rows of one display panel 101 (or the pad located at the fourth row of each display panel 101), and the second terminal 132 of the above-mentioned one first one-way conductive circuit 121 can be electrically connected to a corresponding first test bus line 153 (for example, the leftmost first test bus line 153) and therefore can electrically connected to a corresponding first test terminal 151 (for example, the leftmost first test terminal 151); the first terminal 131 of another first one-way conductive circuit 121 (for example, the first one-way conductive circuit 121 at the third row) can be electrically connected to the first signal lines 111 in even-numbered rows of one display panel 101 (or the pad located at the third row of the display panel 101), and the second terminal 132 of the above-mentioned another first one-way conductive circuit 121 can be electrically connected to a corresponding first test bus line 153 (for example, the first test bus line 153 located at the second position from the left), and therefore can be electrically connected to a corresponding first test terminal 151 (for example, the first test terminal 151 located at the second position from the left).

For example, for the plurality of display panels 101 of the mother substrate 100, the first one-way conductive circuits 121, located at the same positions with respect to the display panels 101 corresponding to the first one-way conductive circuits, can be electrically connected to same one first test bus line 153 and same one first test terminal 151. For example, in the plurality of one-way conductive circuits corresponding to each display panel 101, the first one-way conductive circuit 121 located at the fourth row of each display panel 101 can be electrically connected to the leftmost first test bus line 153 and the leftmost first test terminal 151. For another example, the first one-way conductive circuit 121 located at the third row of each display panel 101 can be electrically connected to the first test bus line 153 located at the second column from the left and the first test terminal 151 located at the second position from the left. Therefore, one first test terminal 151 (for example, the leftmost first test terminal 151) included in the mother substrate 100 can be electrically connected to the first signal lines 111 in odd-numbered rows of each display panel 101, and another first test terminal 151 (for example, the first test terminal 151 located at the second position from the left) included in the mother substrate 100 can be electrically connected to the first signal lines 111 in even-numbered rows of each display panel 101.

For example, in order to avoid the short circuit caused by static electricity discharge due to accumulation of the electrostatic charges at one position of the display panel 101, a plurality of antistatic circuits 141 also can be provided outside the display area 102 of each display panel 101. For example, the settings of the antistatic circuit 141 can be chosen according to specific implementation demands, and no limitations are given in the embodiments of present application in this aspect. For example, as illustrated in FIG. 4A, the antistatic circuit 141 can be provided between adjacent two pads, such that the electrostatic charges can be uniformly distributed on the conductive wires corresponding to the plurality of pads, and therefore, the occurrence probability of defects (for example, short circuit), which are caused by static electricity discharge, in the display panels can be reduced.

Figure 4B:
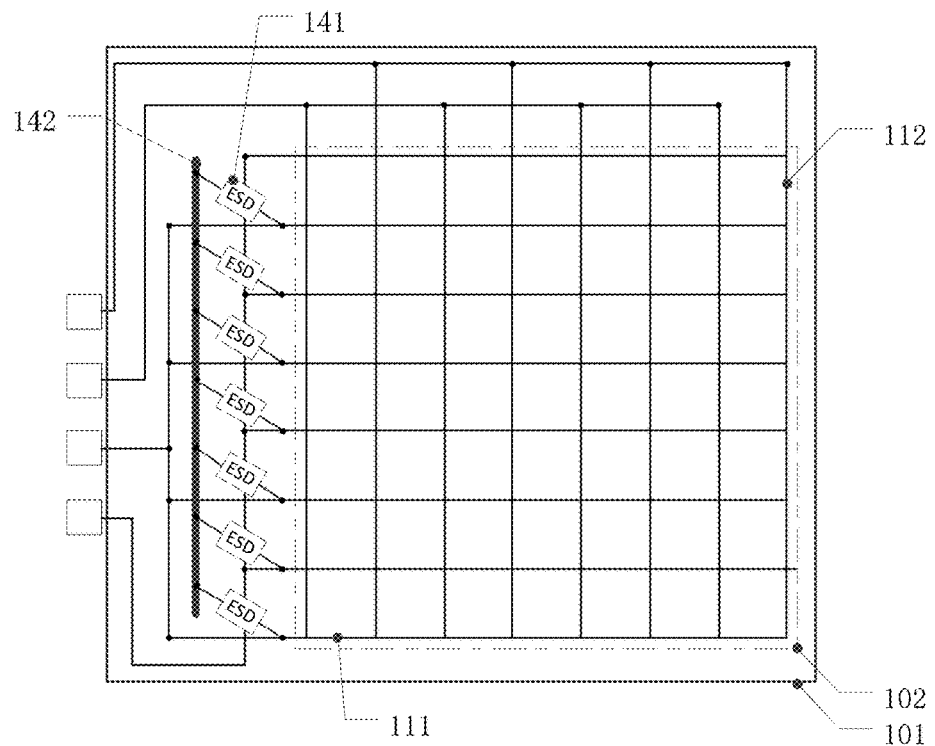
FIG. 4B is a diagram illustrating another method to set an antistatic circuit in the mother substrate as illustrated in FIG. 3A.

For example, as illustrated in FIG. 4B, each display panel 101 can also comprise an electrostatic release line 142 (for example, the electrostatic release line 142 can be grounded), the plurality of antistatic circuits 141 can be outside the display area 102 and respectively electrically connected between the plurality of first signal lines 111 and the electrostatic release line 142. Therefore, the electrostatic charge on the first signal line 111 can leave the display panel 101 via the electrostatic release line 142, such that the occurrence probability of defects (for example, short circuit) caused by static electricity discharge can be reduced. For another example, the plurality of antistatic circuits 141 (not illustrated in FIG. 4B) also can be outside the display area 102 and respectively electrically connected between the plurality of second signal lines 112 and the electrostatic release line 142 (for example, the electrostatic release line 142 can be grounded). For example, the electrostatic release line electrically connected to the plurality of second signal lines 112 and the electrostatic release line electrically connected to the plurality of first signal lines 111 can be the same one electrostatic release line or two different electrostatic release lines; in this case, the electrostatic charges on the second signal line 112 can leave the display panel 101 via the electrostatic release line 142, such that the occurrence probability of defect of the display panel caused by static electricity discharge can be further reduced.

Figure 4C:
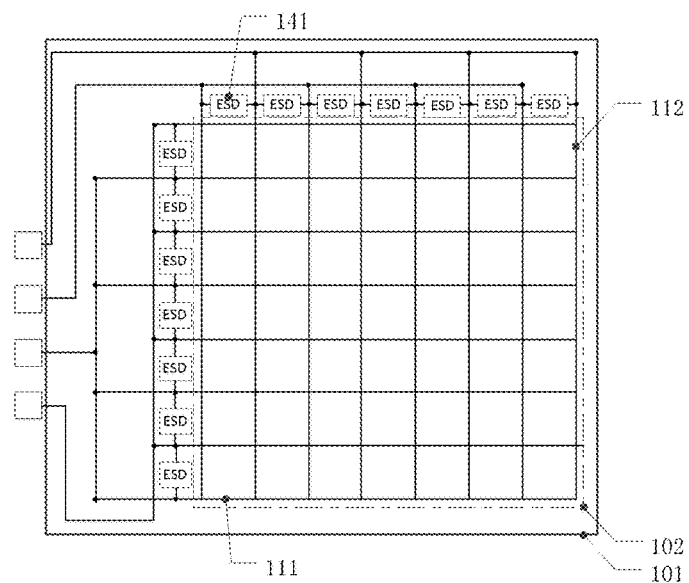
FIG. 4C is a diagram illustrating further another method to set an antistatic circuit in the mother substrate as illustrated in FIG. 3A.

For example, as illustrated in FIG. 4C, the antistatic circuits 141 can be provided between adjacent first signal lines 111, such that the electrostatic charges can be uniformly distributed on the first signal lines 111 of each display panel 101 so as to reduce the occurrence probability of defect caused by static electricity discharge in the display panel. For another example, the antistatic circuit 141 also can be provided between adjacent second signal lines 112, such that the electrostatic charges can be uniformly distributed on the second signal lines 112 of each display panel 101, so as to further reduce the occurrence probability of defects (for example, short circuit) caused by static electricity discharge. Although the plurality of antistatic circuits 141 are provided in each display panel 101, the defect, caused by static electricity discharge, still can exist in the display panel with a small probability, and therefore, it is necessary to locate the display panel 101, with the defect caused by static electricity discharge, in the mother substrate 100 before cutting the mother substrate 100.

Figure 3B:
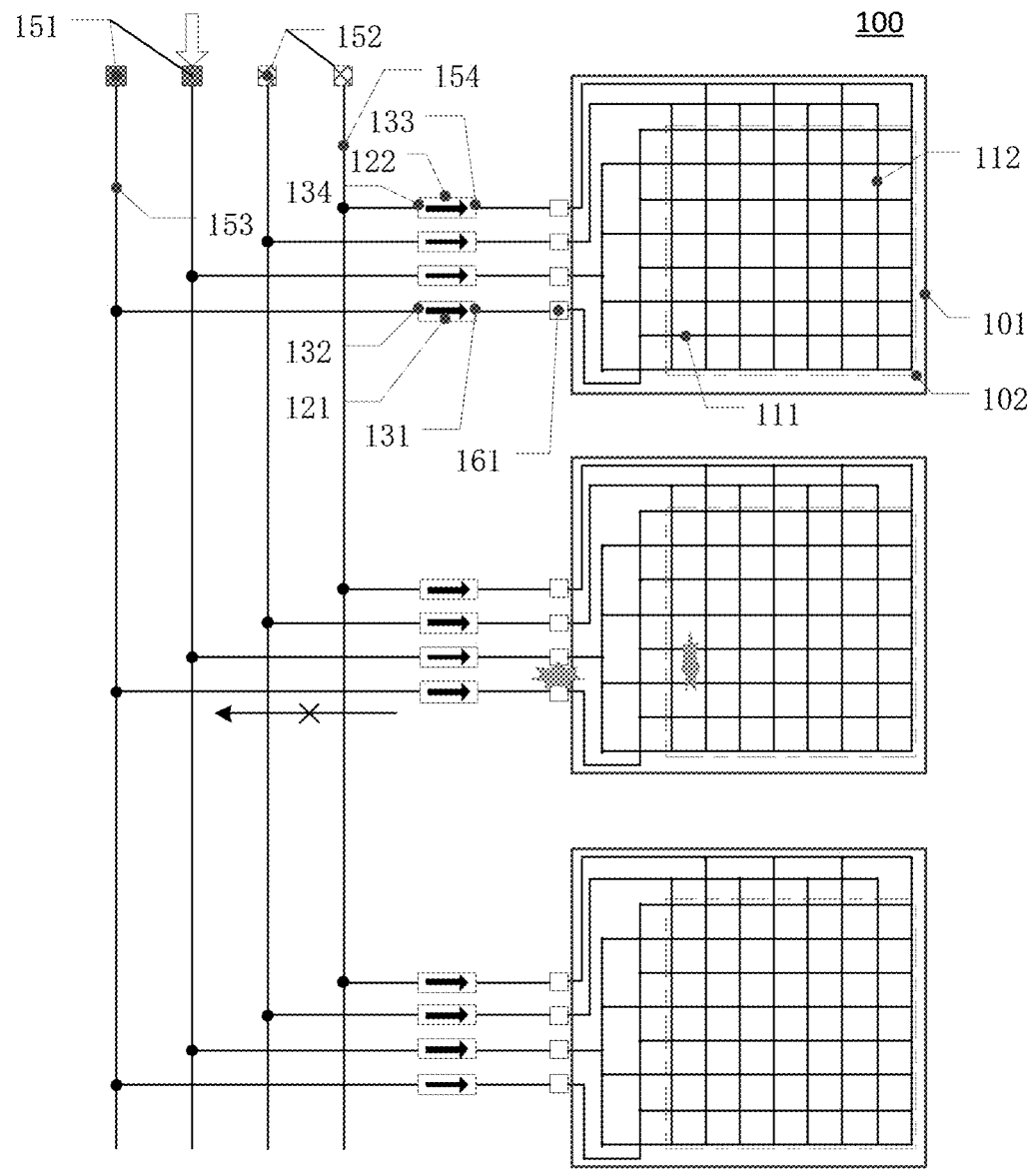
FIG. 3B is a schematic diagram illustrating a method to detect a kind of defect of the mother substrate as illustrated in FIG. 3A.

For example, as illustrated in FIG. 3B, during the test, the scan signals are applied onto the first test terminal 151 located at the second position from the left, and the data signals are applied onto the second test terminals 152 located at the third and fourth position from the left. For example, in the case that the short circuit caused by static electricity discharge does not exist in the display panel 101, for each display panel 101, only the pixels located in even-numbered rows are driven to work (to be lit up), while the pixels located in odd-numbered rows are not driven to work.

For example, as illustrated in FIG. 3B, provided that the static electricity discharge circuit is provided between two adjacent pads, and the short circuit caused by static electricity discharge occurs on the static electricity discharge circuit provided between two pads, corresponding to two first test terminals 151, of the display panel 101 located at the middle position, the electrical signals can be transmitted to the first signal lines 111 in odd-numbered rows of the display panel 101 in the middle position (i.e., the second display panel of the mother substrate in FIG. 3B) via the position where the short circuit occurs. For another example, as illustrated in FIG. 3B, in another case that the short circuit occurs between two adjacent first signal lines 111 of the display panel 101 located at the middle position, the scan signals that are applied to the first signal lines 111 in even-numbered rows via the first test terminal 151 located at the second position from the left are transmitted to the first signal line 111, which is adjacent to the position where the short circuit occurs, in odd-numbered rows via the position where the short circuit occurs, and eventually transmitted to all the first signal lines 111 in odd-numbered rows of the entire display panel 101.

Therefore, for the above-mentioned two cases, the pixels in odd-numbered rows of the display panel 101 located at the middle position can be lit up with a low brightness, or all the pixel of the display panel 101 located at the middle position cannot emit light normally because of low voltages, that is, the display panel 101 located at the middle position shows display abnormality. However, because of the one-way conductive circuit provided in the embodiment of present disclosure, the electric signals cannot be transmitted to the leftmost first test bus line 153, and thus cannot be transmitted to the first signal lines 111 in odd-numbered rows of the display panels 101 located at upper position and lower position, that is, other display panels, except for the display panel with the short circuit caused by static electricity discharge, can perform display function normally. Therefore, in the mother substrate 100 provided by the embodiment of present application, the display panel 101 with the short circuit caused by static electricity discharge can be located, and thus not only test efficiency can be increased, but also undetected error rate can be reduced.

For example, the mother substrate 100 provided by an embodiment of present disclosure can also comprise a plurality of second test terminals 152 and a plurality of second one-way conductive circuits 122. For example, the mother substrate 100 can also comprise a plurality of second test bus line 154. For example, the plurality of second test terminals 152 and the plurality of second one-way conductive circuits 122 can be provided in the cutting area. For example, the plurality of second signal lines 112 of each display panel 101 can be respectively electrically connected to one of the plurality of second test terminals 152 (for example, can be respectively electrically connected to one of the plurality of second test terminals 152 in the cutting area). For example, the number of the second test terminals 152 and electrical connections between the second signal lines 112 and the second test terminals 152 can be chosen according to specific implementation demands, no limitations are given in the embodiment of present application in this aspect. For example, the number of the second test terminals 152 and the electrical connections between the second signal lines 112 and the second test terminals 152 can be set to satisfy the following condition, that is, at least two adjacent second signal lines 112 are electrically connected to different second test terminals 152 via corresponding second one-way conductive circuits 122.

For example, as illustrated in FIG. 3A and FIG. 4A, the mother substrate 100 can comprise two second test terminals 152 electrically connected to the second signal lines 112 of each display panel 101; one of the second test terminals 152 (for example, the second test terminal 152 located at the third position from the left) is electrically connected to the second signal line 112 in odd-numbered columns of each display panel 101, and the other of the second test terminals 152 (for example, the second test terminal 152 located at the fourth position from the left) are electrically connected to the second signal line 112 in even-numbered columns of each display panel 101.

For example, the plurality of second one-way conductive circuits 122 can be respectively electrically connected to the plurality of second signal lines 112 outside the display area 102, and are configured to allow electric signals to be able to transmit only from the plurality of second test terminals 152 to the plurality of second signal lines 112 of each display panel 101. For example, the plurality of second test bus lines 154 can be electrically connected to the plurality of second test terminals 152 (for example, each second test bus line 154 can be electrically connected to one second test terminal 152), each second one-way conductive circuit 122 can be electrically connected to one of the plurality of second test bus lines 154, such that the plurality of second signal lines 112 of each display panel 101 can be respectively electrically connected to one of the plurality of second test terminals 152. For example, each second one-way conductive circuit 122 can comprise a third terminal 133 and a fourth terminal 134, the conducting direction of each second one-way conductive circuit 122 is the direction from the fourth terminal 134 to the third terminal 133; the third terminal 133 can be electrically connected to a corresponding second signal line 112, and the fourth terminal 134 can be electrically connected to a corresponding second test bus line 154, such that signals can only be transmitted from the plurality of second test terminals 152 to the plurality of second signal lines 112 of each display panel 101.

For example, as illustrated in FIG. 3A and FIG. 4A, the mother substrate 100 can comprise two second one-way conductive circuit 122. For example, both the number of the second test bus lines 154 and the number of the second test terminals 152 included in the mother substrate 100 can be equal to the number of the second one-way conductive circuits 122. For example, in the case that the mother substrate 100 comprises two second one-way conductive circuit 122, the mother substrate 100 can comprise two second test terminals 152 and two second test bus lines 154.

For example, in the plurality of one-way conductive circuit (for example, four rows of one-way conductive circuit, including the first one-way conductive circuit 121 and the second one-way conductive circuit 122) corresponding to each display panel 101, the third terminal 133 of one second one-way conductive circuit 122 (for example, the second one-way conductive circuit 122 at the second row) can be electrically connected to the second signal line 112 in odd-numbered columns of one display panel 101 (or the pad at the second row of each display panel 101), and the fourth terminal 134 of the above-mentioned one second one-way conductive circuit 122 can be electrically connected to a corresponding second test bus line 154 (for example, the second test bus line 154 at the third column from the left), and thus can be electrically connected to a corresponding second test terminal 152 (for example, the second test terminal 152 located at the third position from the left). The third terminal 133 of another second one-way conductive circuit 122 (for example, the second one-way conductive circuit 122 at the first row) can be electrically connected to the second signal line 112 in even-numbered columns of one display panel 101 (or the pad at the first row of each display panel 101), and the fourth terminal 134 of the above-mentioned another second one-way conductive circuit 122 can be electrically connected to a corresponding second test bus line 154 (for example, the second test bus line 154 at the fourth column from the left), and thus can be electrically connected to a corresponding second test terminal 152 (for example, the second test terminal 152 located at the fourth position from the left).

For example, for the plurality of display panels 101 of the mother substrate 100, the second one-way conductive circuits 122 located at same one position with respect to corresponding display panels 101 can be electrically connected to same one second test bus line 154 and same one second test terminal 152. For example, in the plurality of one-way conductive circuits corresponding to each display panel 101, all the second one-way conductive circuits 122 at the second row of each display panel 101 are electrically connected to the second test bus line 154 at the third column from the left and the second test terminal 152 located at the third position from the left. For another example, all the second one-way conductive circuits 122 at the first row of each display panel 101 are electrically connected to the second test bus line 154 at the fourth column from the left and the second test terminal 152 located at the fourth position from the left. Therefore, one second test terminal 152 (for example, the second test terminal 152 located at the third position from the left) included in the mother substrate 100 can be electrically connected to the second signal line 112 in odd-numbered columns of each display panel 101 included in the mother substrate 100, and another second test terminal 152 (for example, the second test terminal 152 located at the fourth position from the left) can be electrically connected to the second signal line 112 in even-numbered columns of each display panel 101.

Figure 3C:
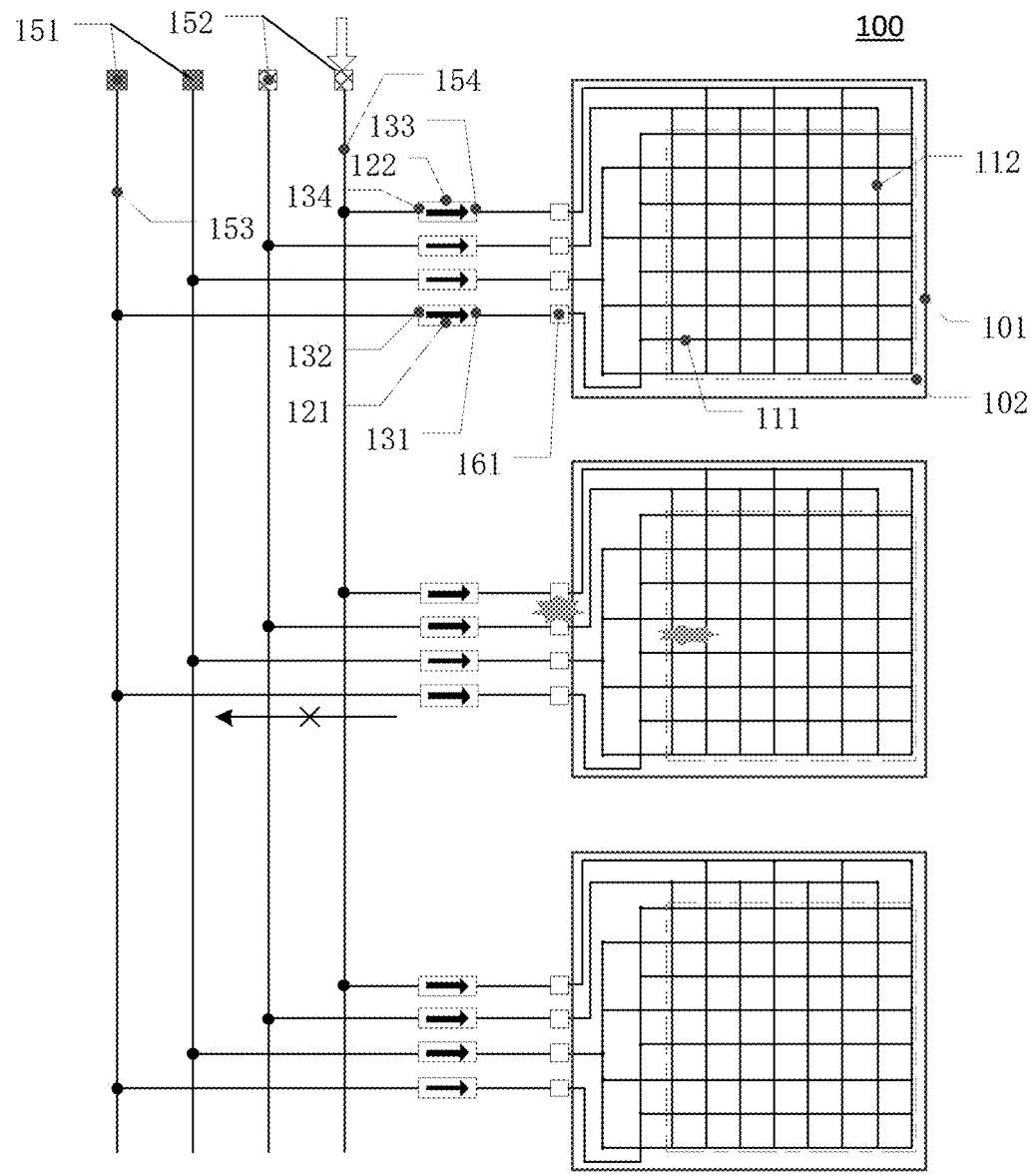
FIG. 3C is a schematic diagram illustrating a method to detect another kind of defect of the mother substrate as illustrated in FIG. 3A.

For example, FIG. 3C is a schematic diagram illustrating a method to detect another kind of defects (for example, short circuit), caused by static electricity discharge, of the mother substrate as illustrated in FIG. 3A.

For example, as illustrated in FIG. 3C, during the test, the data signals are applied to the second test terminal 152 located at the fourth position from the left, and the scan signals are respectively applied to the first test terminal 151 located at the first position from the left and the first test terminal 151 located at the second position from the left. For example, in the case that the short circuit caused by static electricity discharge does not occur in the display panel 101, for each display panel 101, only the pixels located in even-numbered columns are driven to work (i.e., to be lit up), while the pixels in odd-numbered columns are not driven to work.

For example, as illustrated in FIG. 3C, in the case that the static electricity discharge circuits are each provided between two adjacent pads, and the short circuit caused by static electricity discharge occurs on the static electricity discharge circuit provided between two pad, corresponding to two second test terminals 152, of the display panel 101 located at the middle position, the electrical signals can be transmitted to the second signal line 112 in odd-numbered columns of the display panel 101 located at the middle position via the position with the short circuit. For another example, as illustrated in FIG. 3C, in the case that the short circuit occurs between two adjacent second signal lines 112 of the display panel 101 located at the middle position, the data signals, being applied in the second signal line 112 in even-numbered columns via the second test terminal 152 at the fourth position from the left, are transmitted via the position with the short circuit to the second signal line 112, adjacent to the position with the short circuit, in odd-numbered columns, and eventually transmitted to all the second signal line 112 in odd-numbered columns of the entire display panel.

Therefore, for the above-mentioned two cases, the pixels in odd-numbered columns of the display panel 101 located at the middle position can be lit up with a low brightness, or all the pixels in odd-numbered columns and in even-numbered columns of the display panel 101 cannot emit light normally because of low voltage, that is, the display panel 101 located at the middle position shows display abnormality. However, because of the one-way conductive circuit provided by the embodiments of present disclosure, the electric signals cannot be transmitted to the second test bus line 154 at the third column from the left, and therefore cannot be transmitted to the second signal line 112 in odd-numbered columns of the display panels 101 at upper position and lower position, that is, other display panels 101, except for the display panel 101 with the short circuit caused by static electricity discharge, can perform display function normally. Therefore, the mother substrate 100 provided by the embodiments of present application can locate the display panel 101 with the short circuit caused by static electricity discharge, and thus not only test efficiency can be increased, but also undetected error rate can be reduced.

Figure 3D:
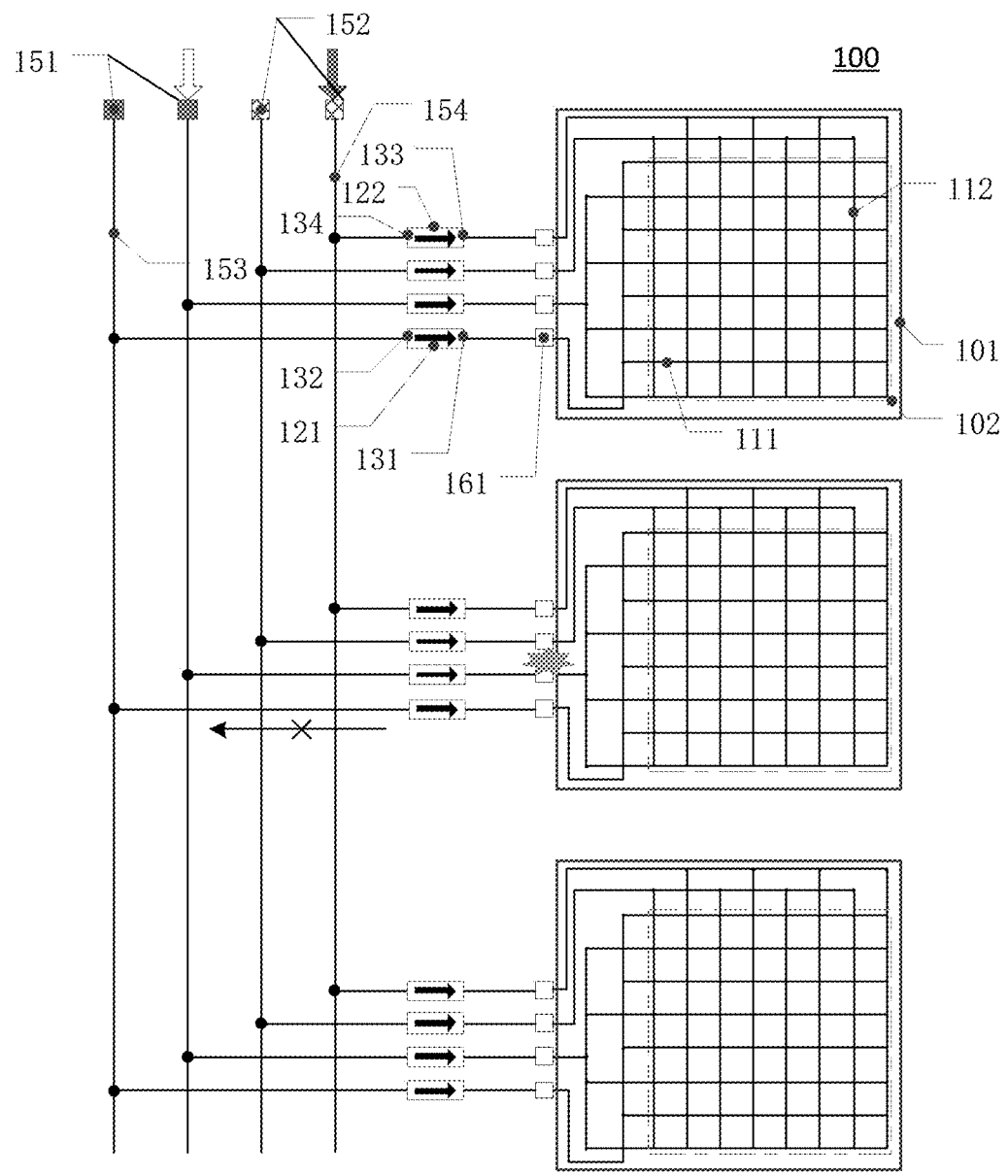
FIG. 3D is a schematic diagram illustrating a method to detect further another kind of defect of the mother substrate as illustrated in FIG. 3A.

For example, FIG. 3D is a schematic diagram illustrating a method to detect further another kind of defect, caused by static electricity discharge short circuit, of the mother substrate as illustrated in FIG. 3A.

For example, as illustrated in FIG. 3D, during the test, the scan signals are applied to the first test terminal 151 located at the second position from the left, and the data signals are applied to the second test terminal 152 at the fourth position from the left. For example, in the case that the short circuit caused by static electricity discharge does not occur in the display panel 101, for each display panel 101, only the pixels in even-numbered rows and even-numbered columns are lit up, and the pixels in odd-numbered columns emit no light.

For example, as illustrated in FIG. 3D, in the case that the static electricity discharge circuit is provided between two adjacent pads and the short circuit caused by static electricity discharge occurs on the static electricity discharge circuit provided between two pad (i.e., the pads at the second row and the third row), corresponding to the first test terminal 151 and the second test terminal 152, of the display panel 101 located at the middle position, the electrical signals can be transmitted to the second signal line 112 in odd-numbered columns of the display panel 101 located at the middle position via the position with the short circuit.

For example, the pixels in odd-numbered columns of the display panel 101 located at the middle position can be lit up with a low brightness, or all the pixels of the display panel 101 located at the middle position cannot emit light normally because of low voltage, that is, the display panel 101 located at the middle position shows display abnormality. However, because of the one-way conductive circuit provided by the embodiments of present disclosure, the electric signal cannot be transmitted to the second test bus line 154 at the third column from the left, and therefore also cannot be transmitted to the second signal line 112 in odd-numbered columns of the display panels 101 at upper position and lower position, that is, other display panels 101, except for the display panel 101 with the short circuit caused by static electricity discharge, can perform display function normally. Therefore, the mother substrate 100 provided by the embodiments of present application can locate the display panel 101 with the short circuit caused by static electricity discharge.

For example, the above-mentioned contents describe the mother substrate 100 provided by an embodiment of present disclosure by taking as an example that the mother substrate 100 comprises two first test terminals 151 and/or two second test terminals 152, but the embodiments of present application are not limited thereto. For example, according to specific implementation demands, the number of the first test terminals 151 included in the mother substrate 100 can also be four and/or the number of the second test terminal 152 included in the mother substrate 100 can also be four. For example, every four rows of first signal lines 111 adjacent to each other can be respectively electrically connected to four first test terminals 151, and every four columns of second signal lines 112 adjacent to each other can be respectively electrically connected to four second test terminals 152. For example, in the case that the display panel 101 comprises N (for example, N is a multiple of four) first signal lines 111, the first signal lines 111 located at row 4A+1, row 4A+2, row 4A+3 and row 4A+4 (A is no less than zero and no larger than N/4) are respectively electrically connected to the first test terminals 151 at the first position from the left, the first test terminals 151 at the second position from the left, the first test terminals 151 at the third position from the left and the first test terminals 151 at the fourth position from the left. For another example, in the case that the display panel 101 comprises N first signal lines 111 and M second signal lines 112, according to specific implementation demands, the mother substrate 100 can also comprise N first test terminal 151 and M second test terminals 152, each first test terminal 151 is electrically connected to one row of the first signal lines 111 of each display panel 101, and each second test terminal 152 is electrically connected to one column of the second signal lines 112 of each display panel 101. For example, specific connections between the first test terminals 151 and the first signal lines 111 and specific connections between the second test terminals 152 and the second signal lines 112 can refer to the embodiment as illustrated in FIG. 3A, and no further descriptions will be given here.

For example, the mother substrate 100 can also comprise test terminals electrically connected to other wires (the common lines). For example, in a case that the number of the first test terminals 151 and/or the number of the second test terminal 152 included in the mother substrate 100 are (is) changed, or the test terminals electrically connected to other wires (common lines) are included, whether or not the display panel with the defect caused by static electricity discharge exists in the mother substrate also can be determined by observing the display situations of the plurality of display panels in the mother substrate after the signals are applied via related test terminals, and specific method will not be described here.

For example, specific structures of the one-way conductive circuit (the first one-way conductive circuit 121 or/and the second one-way conductive circuit 122) can be set according to specific implementation demands, and no limitations are given in the embodiments of present application in this aspect. For example, the one-way conductive circuit can comprise a diode or a transistor. For example, in the case that the one-way conductive circuit is a transistor, a gate electrode of the transistor is electrically connected to a source electrode or a drain electrode of the transistor.

Figure 5A:
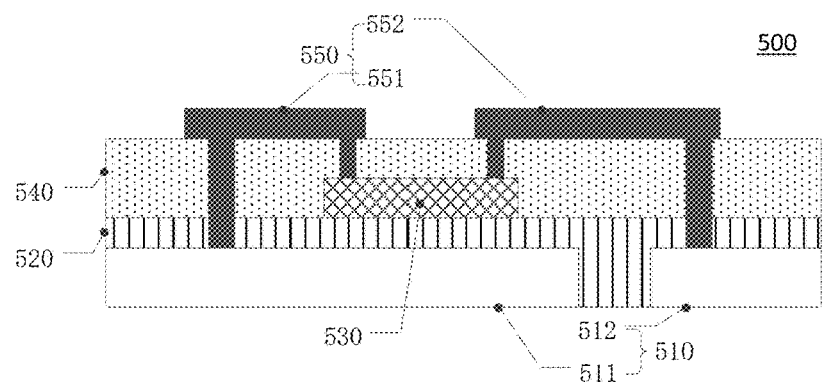
FIG. 5A is a cross-sectional view of a one-way conductive circuit provided by an embodiment of present disclosure.
Figure 5B:
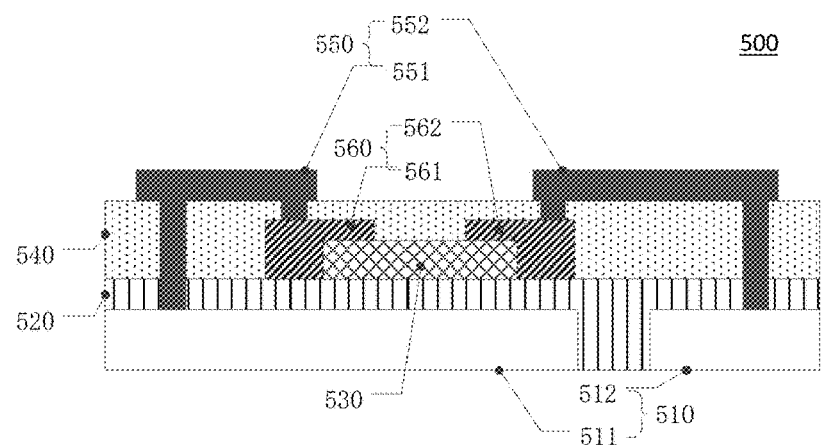
FIG. 5B is a cross-sectional view of another one-way conductive circuit provided by an embodiment of present disclosure.

For example, the one-way conductive circuit 500 can adopt a structure as illustrated in FIG. 5A or FIG. 5B. For example, as illustrated in the cross-sectional view of FIG. 5A, the one-way conductive circuit 500 can comprise a first conductive layer 510, a first insulation layer 520, an active layer 530, a second insulation layer 540 and a second conductive layer 550 sequentially provided. For example, the first conductive layer 510 can comprise a first sub-region 511 (for example, the gate electrode) and a second sub-region 512 which are insulated from each other. For example, the first sub-region 511 and the second sub-region 512 can be arranged to be not overlapped with each other, so as to realize electrical insulation from each other. For example, the second conductive layer 550 can comprise a first connection electrode 551 (for example, the source electrode or the drain electrode) and a second connection electrode 552 (for example, the drain electrode or the source electrode correspondingly), which are insulated from each other, one end of the first connection electrode 551 and one end of the second connection electrode 552 can be respectively electrically connected to the first sub-region 511 and the second sub-region 512 via through holes in the first insulation layer 520 and the second insulation layer 540, and another end of the first connection electrode 551 and another end of the second connection electrode 552 can be respectively electrically connected to the active layer 530. For example, an orthographic projection of the first sub-region 511 on the mother substrate and an orthographic projection of the active layer 530 on the mother substrate can be at least partially overlapped with each other. For example, an orthographic projection of the second sub-region 512 on the mother substrate and the orthographic projection of the active layer 530 on the mother substrate can be not overlapped with each other.

For example, the display panel comprises an array substrate and an opposite substrate (for example, a color filter substrate) opposite to the array substrate. The array substrate comprises a plurality of gate lines, a plurality of data lines and a plurality of sub-pixels; each sub-pixel can comprise a pixel electrode and a thin film transistor as a switching element, the gate electrode of the thin film transistor is connected to one of the gate lines, the source electrode of the thin film transistor is connected to one of the data lines, and the drain electrode of the thin film transistor is connected to the pixel electrode of the sub-pixel in which the thin film transistor is disposed. Further, the sub-pixel can also comprise a common electrode when required, and the common electrode and the pixel electrode cooperate with each other to drive the sub-pixels to display during operation. For example, in order to simplify the manufacturing processes, the first conductive layer 510 can be formed in the same one layer as the gate electrode of the thin film transistor of the sub-pixel of the display panel; the first insulation layer 520 can be formed in the same one layer as the gate insulation layer of the thin film transistor of the sub-pixel of the display panel; the active layer 530 can be formed in the same one layer as the semiconductor layer of the thin film transistor of the sub-pixel of the display panel; the second insulation layer 540 can be formed in the same one layer as the passivation layer covers the thin film transistor of the sub-pixel of the display panel; and the second conductive layer 550 can be formed in the same one layer as the pixel electrode or the common electrode of the display panel.

For example, as illustrated in FIG. 5A, the orthographic projection of the first sub-region 511 on the mother substrate and the orthographic projection of the active layer 530 on the mother substrate are at least partially overlapped with each other, and also one end of the first connection electrode 551 is electrically connected to the first sub-region 511 via a through hole in the first insulation layer 520 and the second insulation layer 540, thus in the case that the a turn-on electric signal is applied onto the first connection electrode 551, the electric signals that are applied onto the first sub-region 511 allow the active layer 530 to become conductive, and thus allows the electric signals to be transmitted to the second connection electrode 552 sequentially via another end of the first connection electrode 551 and the active layer 530. For example, as illustrated in FIG. 5A, in the case that the electric signals are applied onto the second connection electrode 552, although one end of the second connection electrode 552 is electrically connected to the second sub-region 512 via a through hole in the first insulation layer 520 and the second insulation layer 540, the electric signals applied onto the second sub-region 512 cannot allow the active layer 530 to become conductive because the orthographic projection of the second sub-region 512 on the mother substrate and the orthographic projection of the active layer 530 on the mother substrate are not overlapped with each other, and therefore, the electric signals cannot be transmitted to the first connection electrode 551 sequentially via another end of the second connection electrode 552 and the active layer 530. Therefore, the structure as illustrated in FIG. 5A has the capability of one-way electric conduction.

For another example, as illustrated in cross-sectional view of FIG. 5B, the one-way conductive circuit 500 can comprise a first conductive layer 510, a first insulation layer 520, an active layer 530, a third conductive layer 560, a second insulation layer 540 and a second conductive layer 550 sequentially provided. For example, the third conductive layer 560 can comprise a first intermediate electrode 561 and a second intermediate electrode 562, one end of the first intermediate electrode 561 and one end of the second intermediate electrode 562 are respectively electrically connected to the first connection electrode 551 and the second connection electrode 552 via through holes in the second insulation layer 540, and another end of the first intermediate electrode 561 and another end of the second intermediate electrode 562 are respectively electrically connected to the active layer 530. For example, in order to simplify the manufacturing processes, for the one-way conductive circuit 500 as illustrated in FIG. 5B, the third conductive layer 560 can be formed in the same one layer as the source electrode and the drain electrode of the thin film transistor of the sub-pixel of the display panel. For example, compared with the one-way conductive circuit 500 as illustrated in FIG. 5A, not only the one-way conductive circuit 500 as illustrated in FIG. 5B can realize one-way electric conduction function, but also can achieve better contact characteristics between the first connection electrode 551 and the second connection electrode 552, and the active layer 530.

After processes of manufacturing and testing of the mother substrate in the above-mentioned embodiments according to present disclosure are finished, cutting process is performed. For example, cutting process can be performed along the cutting line 109 as illustrated in FIG. 3A, so as to obtain independent display panels, and then follow-up processes are performed to the independent display panels. Because the test terminals, the test bus lines and the one-way conductive circuits are located outside the cutting line 109, the above-mentioned components can be not kept in the independent display panels.

Figure 6A:
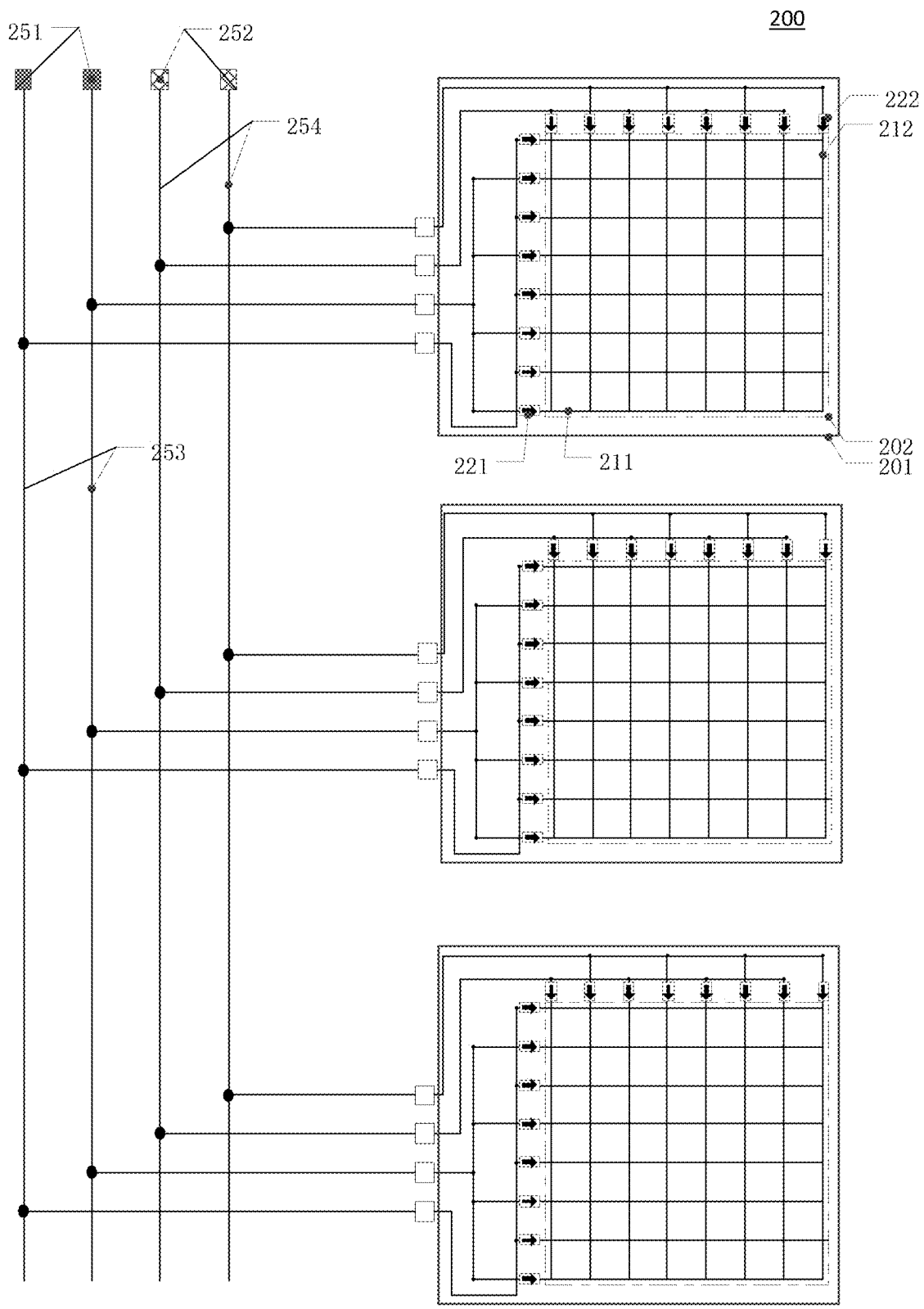
FIG. 6A is a schematic diagram of another mother substrate provided by an embodiment of present disclosure.
Figure 7A:
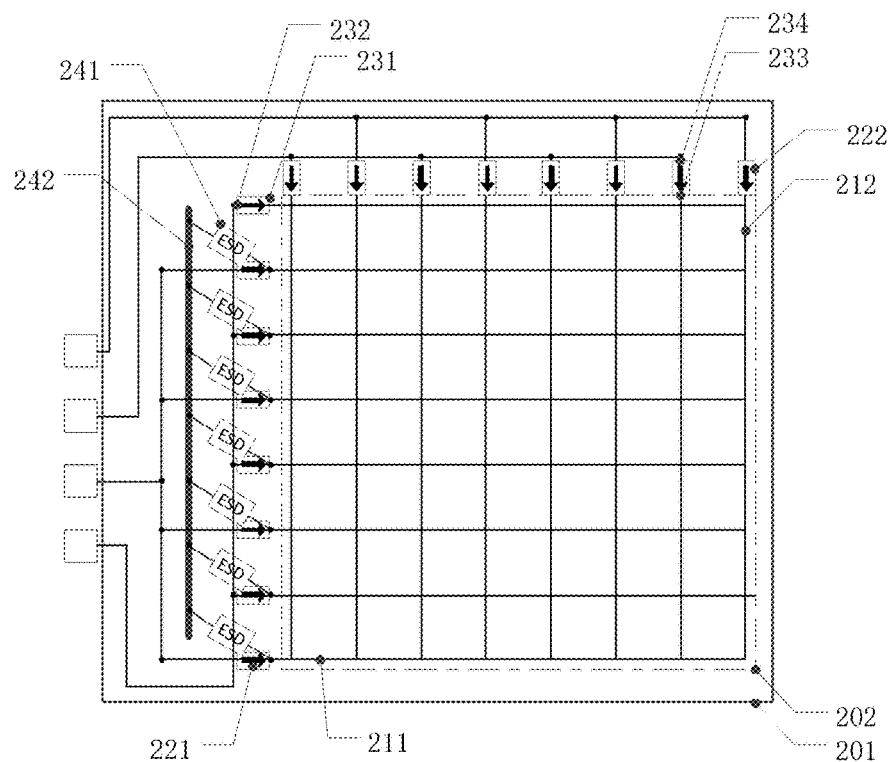
FIG. 7A is a method to set an antistatic circuit in the mother substrate as illustrated in FIG. 6A.
Figure 7B:
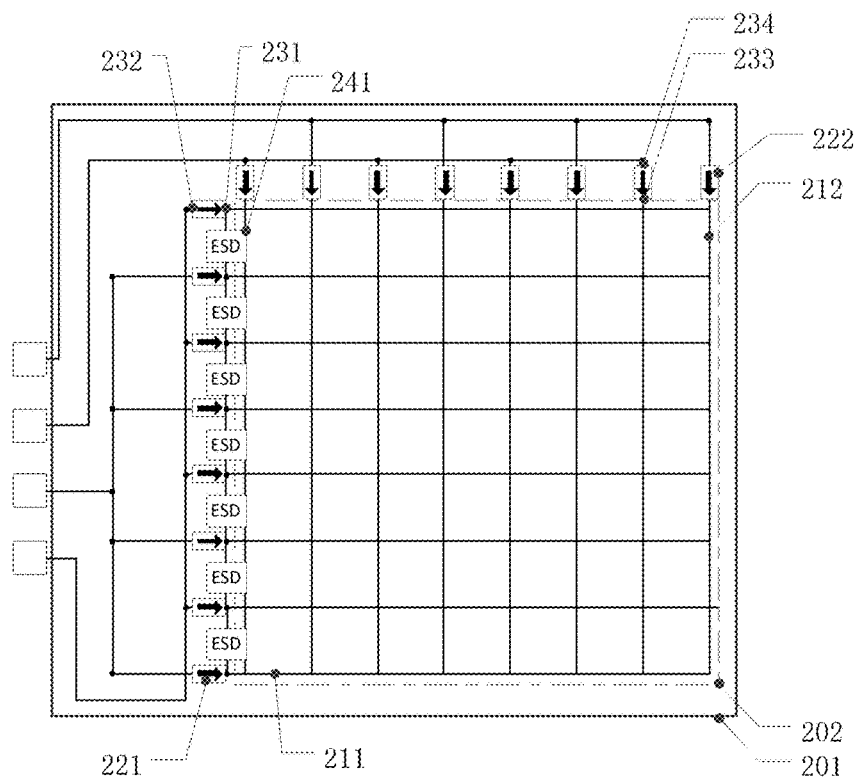
FIG. 7B is another method to set an antistatic circuit in the mother substrate as illustrated in FIG. 6A.

FIG. 6A is a schematic diagram of another mother substrate 200 provided by an embodiment of present disclosure, and FIG. 7A and FIG. 7B are two methods to set an antistatic circuit in the mother substrate 200 as illustrated in FIG. 6A.

For example, as illustrated in FIG. 6A and FIG. 7A, the mother substrate 200 comprises a plurality of display panels 201, a plurality of first test terminals 251 and a plurality of first one-way conductive circuits 221. For example, the mother substrate 200 can also comprise a plurality of first test bus lines 253. For example, each display panel 201 has a display area 202 and comprises a plurality of first signal lines 211 and a second signal line 212 extending from the outside of the display area 202 to the display area 202 in parallel. For example, the number of the first signal lines 211 and the number of the second signal lines 212 arranged can refer to the mother substrate as illustrated in FIG. 3A, and no further descriptions will be given here.

For example, the plurality of first signal lines 211 of each display panel 201 are respectively electrically connected to one of the plurality of first test terminals 251. For example, the number of the first test terminals 251 and electrical connections between the first signal lines 211 and the first test terminals 251 can be chosen according to specific implementation demands, and no limitations are given in the embodiments of present application in this aspect. For example, the number of the first test terminals 251 and the electrical connections between the first signal lines 211 and the first test terminals 251 can satisfy the following requirements, that is, at least two adjacent first signal lines 211 are electrically connected to different first test terminals 251 via corresponding first one-way conductive circuits 221.

For example, as illustrated in FIG. 6A and FIG. 7A, the mother substrate 200 can comprise two first test terminals 251 electrically connected to the first signal line 211 of each display panel 201; one first test terminal 251 (for example, the leftmost first test terminal 251) is electrically connected to the first signal lines 211 in odd-numbered rows of each display panel 201, another first test terminal 251 (for example, the first test terminal 251 located at the second position from the left) is electrically connected to the first signal lines 211 in even-numbered rows of each display panel 201.

For example, the plurality of first one-way conductive circuits 221 are respectively electrically connected to the plurality of first signal lines 211 outside the display area 202 and are configured to allow signals to be able to transmit only from the plurality of first test terminals 251 to the plurality of first signal lines 211 of each display panel 201. For example, compared with the mother substrate as illustrated in FIG. 3A, the first one-way conductive circuits 221 of the mother substrate 200 as illustrated in FIG. 6A can be provided between the pads 261 and the first signal lines 211 (for example, provided between the pads 261 and the first signal lines 211 in an extension direction of the first signal lines 211), and each first one-way conductive circuit is electrically connected to one corresponding first signal line 211.

For example, each first one-way conductive circuit 221 can comprise a first terminal 231 and a second terminal 232, and the conducting direction of each first one-way conductive circuit 221 is the direction from the second terminal 232 to the first terminal 231. For example, the first terminal 231 of each first one-way conductive circuit 221 can be electrically connected to a corresponding first signal line 211, and the second terminal 232 of each first one-way conductive circuit 221 can be electrically connected to a corresponding first test bus line 253 and a corresponding first test terminal 251 via a corresponding pad 261, such that the signals can only be transmitted to the plurality of first signal lines 211 of each display panel 201 from the plurality of first test terminals 251. For example, corresponding relationships between the pads 261, the first test bus lines 253 and the first test terminals 251 can refer to the embodiments as illustrated in FIG. 3A, and no further descriptions will be given here.

For example, the mother substrate 200 provided by another embodiment of present disclosure can also comprise a plurality of second test terminals 252 and a plurality of second one-way conductive circuits 222. For example, the mother substrate 200 can also comprise a plurality of second test bus line 254. For example, the plurality of second signal lines 212 of each display panel 201 are respectively electrically connected to one of the plurality of second test terminals 252. For example, the number of the second test terminals 252, and electrical connections between the second signal lines 212 and the second test terminals 252 can be chosen according to specific implementation demands, and no limitations are given in the embodiments of present application in this aspect. For example, at least two adjacent second signal lines 212 can be electrically connected to different second test terminals 252 via corresponding second one-way conductive circuits 222.

For example, as illustrated in FIG. 6A and FIG. 7A, the mother substrate 200 can comprise two second test terminals 252 electrically connected to the second signal lines 212 of each display panel 201, one second test terminal 252 (for example, the second test terminal 252 located at the third position from the left) is electrically connected to the second signal lines 212 in odd-numbered columns of each display panel 201, and another second test terminal 252 (for example, the second test terminal 252 located at the fourth position from the left) is electrically connected to the second signal lines 212 in even-numbered columns of each display panel 201.

For example, the plurality of second one-way conductive circuits 222 can be electrically connected to the plurality of second signal lines 212 outside the display area 202, and are configured to allow the electric signals to be able to transmit only from the plurality of second test terminals 252 to the plurality of second signal lines 212 of each display panel 201. For example, compared with the mother substrate 200 as illustrated in FIG. 3A, the second one-way conductive circuits 222 of the mother substrate 200 as illustrated in FIG. 6A can be provided in a peripheral area of the display panel 201. For example, the second one-way conductive circuits 222 can be provided at the upside of the display area 202 of the display panel 201 in FIG. 7A, and each second one-way conductive circuit 222 is electrically connected to one corresponding second signal line 212.

For example, each second one-way conductive circuit 222 can comprise a third terminal 233 and a fourth terminal 234, and the conducting direction of each second one-way conductive circuit 222 can be the direction from the fourth terminal 234 to the third terminal 233; the third terminal 233 of each second one-way conductive circuit 222 can be electrically connected to one corresponding second signal line 212, and the fourth terminal 234 of each second one-way conductive circuit 222 can be electrically connected to a corresponding second test bus line 254 and a corresponding second test terminal 252 via a corresponding pad 261, so as to allow the signals to be able to transmit only from the plurality of second test terminals 252 to the plurality of second signal lines 212 of each display panel 201. For example, corresponding relationships between the pads 261, the second test bus lines 254 and the second test terminals 252 can refer to the embodiments as illustrated in FIG. 3A, and no further descriptions will be given here.

For example, in order to avoid the short circuit caused by static electricity discharge due to accumulation of the electrostatic charge at one position of the display panel 201, a plurality of antistatic circuits 241 also can be provided outside the display area 202 of each display panel 201. For example, the settings of the antistatic circuit 241 can be set according to specific implementation demands, no limitations are given in the embodiments of present application in this aspect.

For example, as illustrated in FIG. 7A, each display panel 201 can comprise an electrostatic release line 242 (for example, the electrostatic release line 242 can be grounded) and a plurality of antistatic circuits 241, and the plurality of antistatic circuits 241 can be respectively provided between and electrically connected to the plurality of first signal lines 211 and the electrostatic release line 242 outside the display area 202, and can be respectively provided between and electrically connected to the first terminals 231 of the plurality of first one-way conductive circuits 221 and the electrostatic release line 242. Therefore, the electrostatic charge on the first signal line 211 can leave the display panel 201 via the electrostatic release line 242, such that the occurrence probability of defects (for example, short circuit) caused by static electricity discharge can be reduced. For another example, a plurality of antistatic circuits 241 (not illustrated in FIG. 7A) can also be respectively provided and electrically connected to the plurality of second signal lines 212 and the electrostatic release line 242 (for example, the electrostatic release line 242 can be grounded) outside the display area 202, and can be respectively provided and electrically connected to the third terminal 233 of the plurality of second one-way conductive circuits 222 and the electrostatic release line 242. Therefore, the electrostatic charges on the second signal lines 212 can leave the display panel 201 via the electrostatic release line 242, and the occurrence probability of the defects (for example, short circuit) caused by static electricity discharge can be further reduced.

For example, as illustrated in FIG. 7B, each display panel 201 can further comprise a plurality of antistatic circuits 241, and each of the antistatic circuits 241 can be provided between adjacent two first signal lines 211, and can be provided between the first terminals 231 of two first one-way conductive circuits 221 electrically connected to the adjacent two first signal lines 211; in this case, the electrostatic charges can be uniformly distributed on the first signal lines 211 of each display panel 201 so as to reduce the occurrence probability of defect of the display panel caused by static electricity discharge. For another example, the antistatic circuit 241 also can be provided between adjacent two second signal lines 212 (not illustrated in FIG. 7B), and can be provided between the third terminals 233 of two second one-way conductive circuits 222 electrically connected to the adjacent two second signal lines 212; in this case, the electrostatic charges can be uniformly distributed on the second signal lines 212 of each display panel 201 so as to further reduce the occurrence probability of defect of the display panel caused by static electricity discharge. Although the plurality of antistatic circuits 241 are provided in each display panel 201, the defect, caused by static electricity discharge, still can exist in the display panel with a certain probability, and therefore, the display panel 201, with the defect caused by static electricity discharge, in the mother substrate 200 need to be located before cutting the mother substrate 200.

For example, as illustrated in FIG. 6A, during the test, the scan signals are applied onto the first test terminal 251 located at the second position from the left, and the data signals are applied onto the second test terminals 252 located at the third and fourth position from the left. For example, in the case that the short circuit caused by static electricity discharge does not occur in the display panel 201, for each display panel 201, only the pixels located in even-numbered rows are driven to work (i.e., to be lit up), while the pixels located in odd-numbered rows are not driven to work.

Figure 6B:
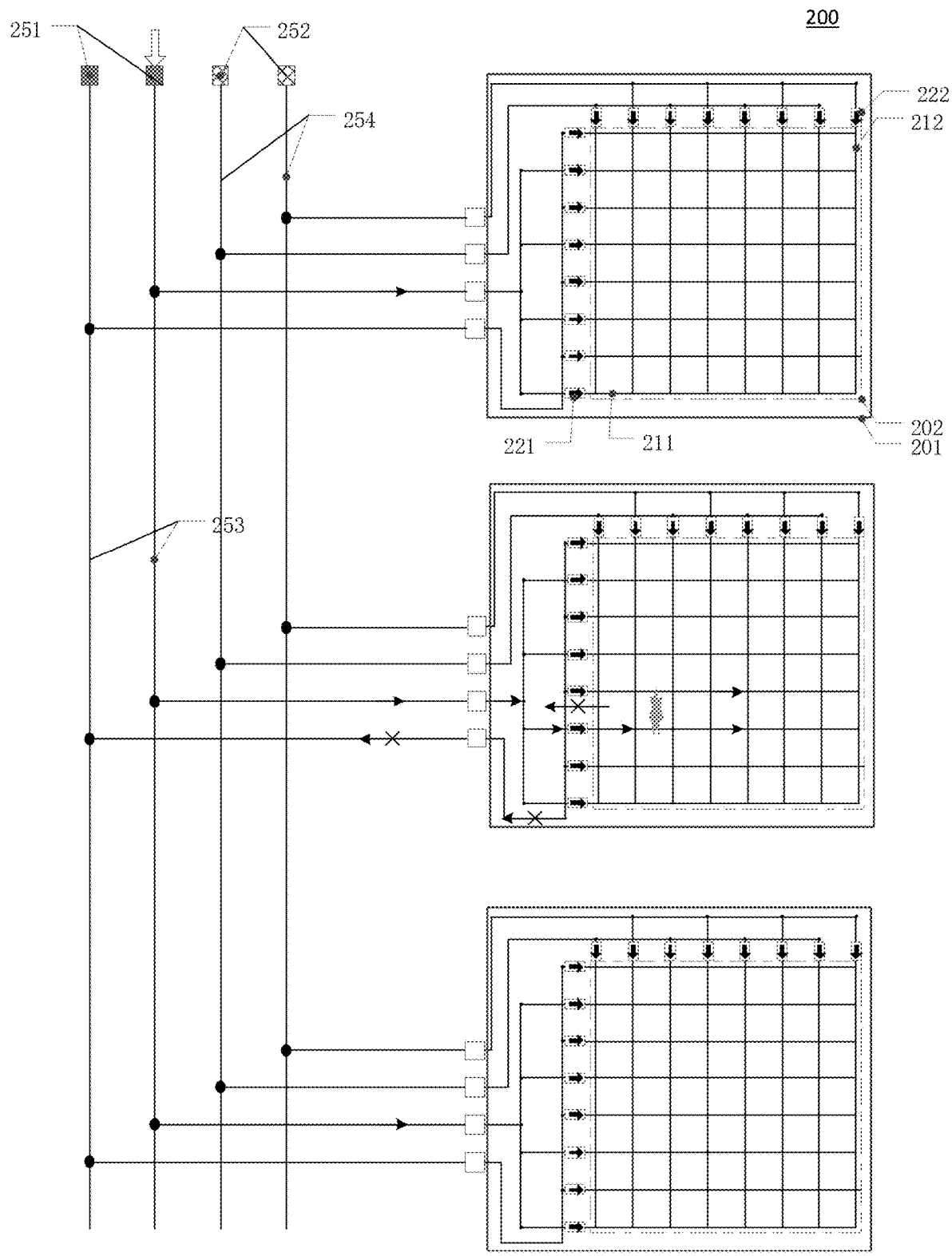
FIG. 6B is a schematic diagram illustrating a method to detect a kind of defect of the mother substrate as illustrated in FIG. 6A.

For example, FIG. 6B is a schematic diagram illustrating a method to detect a kind of defect of the mother substrate 200 as illustrated in FIG. 6A. For example, as illustrated in FIG. 6B, in the case that the short circuit occurs between adjacent two first signal lines 211 of the display panel 201 located at the middle position, the scan signals, that are applied on to the first signal line 211 in even-numbered rows via the first test terminal 251 located at the second position from the left, are transmitted via the position with the short circuit to the first signal line 211, which is adjacent to the position with the short circuit, in odd-numbered rows. However, because of the one-way conductive circuit provided by the embodiments of present disclosure, the electric signals cannot be transmitted to other first signal lines 211 in odd-numbered rows of the display panel 201 located at the middle position, and therefore, also cannot be transmitted to the leftmost test bus line 253, and the first signal lines 211 in odd-numbered rows of the display panel 201 at upper position and lower position. Therefore, for the above-mentioned case, the pixels in one row, related to the short circuit, of the odd-numbered rows of the display panel 201 located at the middle position, can be lit up with a low brightness, or all the pixels in the row of the odd-numbered rows and in the row of the even-numbered rows, which are related to the short circuit, of the display panel 201 located at the middle position cannot emit light normally because of low voltage, that is, partial region of the display panel 201 located at the middle position shows display abnormity. Therefore, for another one-way conductive circuit provided by the embodiments of present application, not only the display panel 201, with the defects (for example, short circuit) caused by static electricity discharge, in the mother substrate 200 can be located, but also the positions of the defect in the display panel 201 can further be determined.

For example, as illustrated in FIG. 6A, for another mother substrate 200 provided by an embodiment of present disclosure, in the case that the defect caused by static electricity discharge exists between two adjacent second signal lines 212, the display panel 201, with the defect caused by static electricity discharge, in the mother substrate 200, and the position of the defect in the display panel 201 can be located by observing whether or not the display defects exists in partial regions of the display panel 201 after the data signals are applied onto the second test terminal 252 located at the fourth position from the left, and the scan signals are applied onto the first test terminal 251 located at the second position from the left. For example, other kinds of the defects caused by static electricity discharge can refer to the mother substrate 200 provided by an embodiment of present disclosure, and no further descriptions will be given here.

After processes of manufacturing and testing of the mother substrate in the above-mentioned embodiments according to present disclosure are finished, cutting process is also performed so as to obtain independent display panels, and then follow-up processes are performed to the independent display panels. Because the test terminals, the test bus lines and the one-way conductive circuits can be cut out, the above-mentioned components can be not kept in the independent display panels obtained.

For example, another embodiment of present disclosure provides a display panel, and the display panel includes a display area and comprises a plurality of first signal lines and a plurality of first one-way conductive circuits. For example, the plurality of first signal lines extend from outside of the display area to the display area in parallel; the plurality of first one-way conductive circuits are respectively electrically connected to the plurality of first signal lines outside the display area, and are configured to allow signals in each of the first signal lines to be capable of transmitting toward only one direction. For example, according to specific implementation demands, the display panel can also comprise a plurality of second signal lines being intersected with (for example, being perpendicular to) the plurality of first signal lines and comprise a plurality of second one-way conductive circuits. For example, the plurality of second signal lines extend from the outside of the display area to the display area in parallel; the plurality of second one-way conductive circuits are respectively electrically connected to the plurality of second signal lines outside the display area, and are configured to allow signals in each of the second signal lines to be capable of transmitting toward only one direction. For example, detail contents regarding the display panel can refer to the embodiments as illustrated in FIG. 6A, FIG. 6B, FIG. 7A and FIG. 7B, and no further descriptions will be given here.

For example, at least one embodiment of present disclosure further provides a test method for the mother substrate, and the test method for the mother substrate comprises: applying test signals into the first signal lines of each display panel via corresponding first one-way conductive circuits with the plurality of first test terminals, and performing determination based on display situations of the plurality of display panels.

Figure 8:
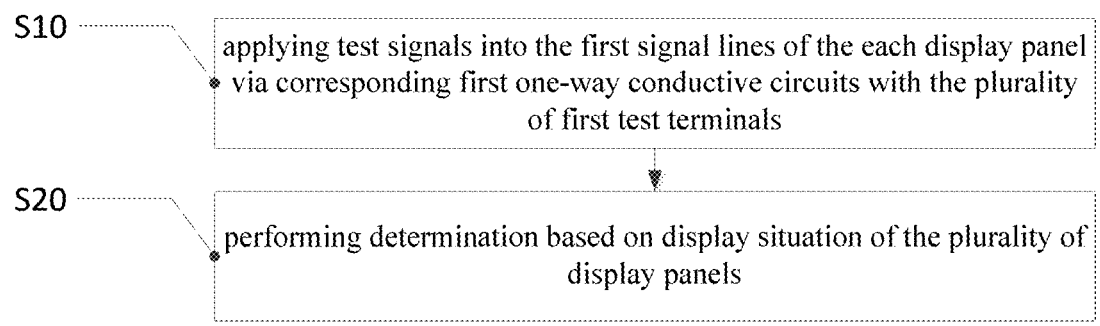
FIG. 8 is a flow chart of a test method for a mother substrate provided by further another embodiment of present disclosure.

For example, FIG. 8 is a flow chart of the test method for the mother substrate provided by further another embodiment of present disclosure. For example, by taking the case as illustrated in FIG. 3A and FIG. 3B as an example, the test method of the mother substrate can comprise the following steps:

Step S10: applying test signals into the first signal lines of each display panel via corresponding first one-way conductive circuits with the plurality of first test terminals; and Step S20: performing determination based on display situations of the plurality of display panels.

For example, in the step S10, the scan signals are applied onto the first test terminal located at the second position from the left, and the data signals are applied onto the second test terminals located at the third and fourth position from the left. In this case, the test signals can be applied into the first signal lines in even-numbered rows of each display panel via corresponding first one-way conductive circuits with the first test terminal located at the second position from the left.

For example, as illustrated in FIG. 3B, in the case that the static electricity discharge circuits are provided between two adjacent pads, and the short circuit caused by static electricity discharge occurs on the static electricity discharge circuit provided between two pads, corresponding to two first test terminals, of the display panel located at the middle position, the electric signals are transmitted to the first signal lines in odd-numbered rows of the display panel located at the middle position via the position with the short circuit. For another example, as illustrated in FIG. 3B, in the case that the short circuit occurs between adjacent two first signal lines of the display panel located at the middle position, the scan signals, which are applied into the first signal lines in even-numbered rows via the first test terminal located at the second position from the left, are transmitted to the first signal line, which is adjacent to the position with the short circuit, in odd-numbered rows, and eventually transmitted to all the first signal lines in odd-numbered rows of the display panel located at the middle position.

Therefore, for the above-mentioned two cases, the pixels in odd-numbered rows of the display panel located at the middle position can be lit up with a low brightness, or all the pixels in odd-numbered rows and in even-numbered rows of the display panel located at the middle position cannot emit light normally because of low voltage, that is, the display panel located at the middle position shows display abnormity. However, because of the one-way conductive circuit provided by the embodiments of present disclosure, the electric signals cannot be transmitted to the leftmost first test bus line, and thus cannot be transmitted to the first signal lines in odd-numbered rows of the display panels located at upper position and lower position, that is, other display panels, except for the display panel with the short circuit caused by static electricity discharge, can perform display function normally. Therefore, in the step S20, the display panel with the short circuit caused by static electricity discharge can be located based on the display situations of the plurality of display panels (for example, whether or not the display abnormality occurs).

For another example, in the step S10, the scan signals are applied onto the leftmost first test terminal, and the data signals are applied onto the second test terminals located at the third and the fourth position. In this case, the test signals can be applied into the first signal lines in odd-numbered rows of each display panel via a corresponding first one-way conductive circuit with the leftmost first test terminal.

For example, as illustrated in FIG. 3B, in the case that the short circuit caused by static electricity discharge occurs on the static electricity discharge circuit provided between two pads corresponding to two first test terminals or/and in the case that the short circuit caused by static electricity discharge occurs between adjacent two first signal lines of the display panel located at the middle position, the electric signals can transmit to the first signal lines in even-numbered rows of the display panel located at the middle position via the position with the short circuit Therefore, the display panel located at the middle position shows the display abnormity. However, because of the one-way conductive circuit provided by the embodiments of present disclosure, the electric signals cannot be transmitted to the test bus line at the second columns from the left, and therefore cannot be transmitted to the first signal lines in even-numbered rows of the display panels located at upper position and lower position, that is, other display panels, except for the display panel with the short circuit caused by static electricity discharge, can perform display function normally. Therefore, in the step S20, the display panel with the short circuit caused by static electricity discharge can be located based on the display situations of the plurality of display panels (for example, whether or not the display abnormality occurs).

For example, the present disclosure describes the embodiments of present application by taking as an example that the mother substrate comprises two first test terminals, but the embodiments of present application are not limited thereto. For example, in the case that the mother substrate comprises four first test terminal, firstly, the scan signals can be applied into the first signal lines, which are not overlapped with each other by other first signal lines, of the first group, via one first test terminal, and whether or not the defect (for example, the short circuit) exists between the first signal lines of the first group and the first signal lines adjacent to the first signal lines of the first group can be determined; and then whether or not the defect (for example, the short circuit) exists between the first signal lines of the second/third/fourth group and the first signal lines adjacent to the first signal lines of the second/third/fourth group can be determined by observing the display situations of the display panel after the scan signals are applied into the first signal lines, which are not overlapped with each other by other first signal lines, of the second/third/fourth group. For example, the test signals can be sequentially applied into the first signal lines of the first group, the second group, the third group, and the fourth group, so as to sequentially determine whether or not the defect (for example, the short circuit) exists between the first signal lines of the first/second/third/fourth group and the first signal lines adjacent to the first signal lines of the first/second/third/fourth group, but the embodiments of present application are not limited thereto. For example, according to specific implementation demands, the test signals also can be sequentially applied into the first signal lines of the fourth group, the second group, the third group, and the first group, so as to sequentially determine whether or not the defect (for example, the short circuit) exists between the first signal lines of the fourth group, the second group, the third group and the first group and the first signal lines adjacent to the first signal lines of the fourth group, the second group, the third group and the first group.

For example, according to specific implementation demands, the example of the test method of the mother substrate can also comprise the following steps:

Step S30: applying the test signals into the second signal lines of each display panel via corresponding second one-way conductive circuits with the plurality of second test terminals; and Step S40: performing determination based on the display situations of the plurality of display panels.

For example, specific test method and determine method in the step S30 and the step S40 are similar to the method in the steps S10 and S20, detailed content can refer to the embodiments as illustrated in FIG. 3C, and no further descriptions will be given here.

For example, according to specific implementation demands, the test method of the mother substrate provided by further another embodiment of present disclosure can perform the steps S30 and S40 first, and then can perform the steps S10 and S20, such that whether or not the short circuit exists between the second signal lines or/and existed between the pads electrically connected to the second signal lines can be firstly determined, and whether or not the short circuit exists between the first signal lines or/and existed between the pads electrically connected to the first signal lines can then be determined.

For example, according to specific implementation demands, the test method of the mother substrate provided by further another embodiment of present disclosure can determine whether or not the defects (for example, short circuit) exist between the first signal line and the second signal line of each display panel by observing the display situations of the display panels, detailed contents can refer to the embodiments as illustrated in FIG. 3D, and no further descriptions will be given here.

For example, in the case that the mother substrate further comprises other test terminals electrically connected to other wires (for example, the common lines), whether or not the following defects exist in each display panel can be determined by referring to the above-mentioned test method; for example, whether or not the short circuit exists between wires electrically connected to other test terminals; for another example, whether or not the short circuit exists between wires electrically connected to the first/second test terminals and wires electrically connected to other test terminals, and no further descriptions will be given here.

For example, the test method of the mother substrate provided by the embodiments of present disclosure not only can apply in the mother substrate as illustrated in FIG. 3A, but also can apply in the mother substrate as illustrated in FIG. 6A and other mother substrates including the one-way conductive circuit, specific test process can be adjusted according to the concrete structure of the mother substrate and the mother substrate as illustrated in FIG. 3A and FIG. 6A, and no further descriptions will be given here.

Embodiments of present application provide a mother substrate and a display panel, and the mother substrate and the display panel can locate display panels, with the defect caused by static electricity discharge, in the mother substrate.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

The application claims priority to Chinese patent application No. 201710326287.0, filed on May 10, 2017, the entire disclosure of which is incorporated herein by reference as part of the present application.

What is claimed is:

1. A mother substrate, comprising:
    a plurality of display panels, wherein each of the display panels has a display area, and comprises a plurality of first signal lines extending from outside of the display area to the display area in parallel;
    a plurality of first test terminals, wherein the plurality of first signal lines of each of the display panels are respectively electrically connected to one of the plurality of first test terminals; and
    a plurality of first one-way conductive circuits, wherein the plurality of first one-way conductive circuits are respectively electrically connected to the plurality of first signal lines outside of the display area, and are configured to allow signals to be able to transmit only from the plurality of first test terminals to the plurality of first signal lines of each of the display panels,
    wherein each first one-way conductive circuit comprises a first conductive layer, a first insulation layer, an active layer, a second insulation layer, and a second conductive layer sequentially provided;
    the first conductive layer comprises a first sub-region and a second sub-region which are insulated from each other; and
    the second conductive layer comprises a first connection electrode and a second connection electrode which are insulated from each other, one end of the first connection electrode and one end of the second connection electrode are electrically connected to the first sub-region and the second sub-region respectively via through holes in the first insulation layer and the second insulation layer, and another end of the first connection electrode and another end of the second connection electrode are respectively electrically connected to the active layer.

2. The mother substrate according to claim 1, further comprising a plurality of first test bus lines,
wherein the plurality of first test bus lines are electrically connected to the plurality of first test terminals,
each of the first one-way conductive circuits is electrically connected to one of the plurality of first test bus lines, such that the plurality of first signal lines of each of the display panels are respectively electrically connected to the one of the plurality of first test terminals.

3. The mother substrate according to claim 2, wherein
each of the first one-way conductive circuits comprises a first terminal and a second terminal;
the first terminal is electrically connected to a corresponding one of the first signal lines;
the second terminal is electrically connected to a corresponding one of the first test bus lines; and a conducting direction of each of the first one-way conductive circuits is a direction from the second terminal to the first terminal, such that the signals are only allowed to be transmitted from the plurality of first test terminals to the plurality of first signal lines of each of the display panels.

4. The mother substrate according to claim 3, wherein
each of the display panels further comprises a plurality of antistatic circuits and an electrostatic release line; and
the plurality of antistatic circuits are respectively provided between and electrically connected to the plurality of first signal lines and the electrostatic release line outside of the display area, and are respectively provided between and electrically connected to first terminals of the plurality of first one-way conductive circuits and the electrostatic release line.

5. The mother substrate according to claim 3, wherein
each of the display panels further comprises a plurality of antistatic circuits, each of the antistatic circuits is provided between adjacent two first signal lines, and is provided between first terminals of two first one-way conductive circuits electrically connected to the adjacent two first signal lines.

6. The mother substrate according to claim 1, further comprising a cutting area,
wherein the first test terminals are provided in the cutting area,
the plurality of first signal lines of each of the display panels are respectively electrically connected to the one of the plurality of first test terminals in the cutting area.

7. The mother substrate according to claim 6, wherein the plurality of first one-way conductive circuits are provided in the cutting area.

8. The mother substrate according to claim 1, wherein
at least two adjacent first signal lines are electrically connected to different first test terminals via corresponding first one-way conductive circuits.

9. The mother substrate according to claim 8, wherein
the mother substrate comprises at least two first test terminals electrically connected to the first signal lines of each of the display panels,
one of the at least two first test terminals is electrically connected to the first signal lines in odd-numbered rows of each of the display panels, and another first test terminal of the at least two first test terminals is electrically connected to the first signal lines in even-numbered rows of each of the display panels.

10. The mother substrate according to claim 1, further comprising: a plurality of second test terminals and a plurality of second one-way conductive circuits,
wherein each of the display panels further comprises a plurality of second signal lines extending from the outside of the display area to the display area in parallel, wherein the plurality of second signal lines intersect with the plurality of first signal lines;
the plurality of second signal lines of each of the display panels are respectively electrically connected to one of the plurality of second test terminals; and
the plurality of second one-way conductive circuits are respectively electrically connected to the plurality of second signal lines outside of the display area, and are configured to allow signals to be able to transmit only from the plurality of second test terminals to the plurality of second signal lines of each of the display panels.

11. The mother substrate according to claim 10, further comprising a plurality of second test bus lines,
wherein the plurality of second test bus lines are electrically connected to the plurality of second test terminals, and each of the second one-way conductive circuits is electrically connected to one of the plurality of second test bus lines, such that the plurality of second signal lines of each of the display panels are respectively electrically connected to the one of the plurality of second test terminals.

12. The mother substrate according to claim 10, wherein
at least two adjacent second signal lines are electrically connected to different second test terminals via corresponding second one-way conductive circuits.

13. The mother substrate according to claim 1, wherein
the first one-way conductive circuit further comprises a third conductive layer;
the third conductive layer is provided between the first insulation layer and the second insulation layer;
the third conductive layer comprises a first intermediate electrode and a second intermediate electrode;
one end of the first intermediate electrode and one end of the second intermediate electrode are respectively electrically connected to the first connection electrode and the second connection electrode via through holes in the second insulation layer; and
another end of the first intermediate electrode and another end of the second intermediate electrode are respectively electrically connected to the active layer.

14. The mother substrate according to claim 13, wherein
each of the display panels comprises a thin film transistor;
the first conductive layer and a gate electrode of the thin film transistor are in a same one layer;
the first insulation layer and a gate insulation layer of the thin film transistor are in a same one layer;
the active layer and a semiconductor layer of the thin film transistor are in a same one layer;
the second insulation layer and a passivation layer of the thin film transistor are in a same one layer;
the second conductive layer and a pixel electrode or a common electrode of the display panel are in a same one layer; and
the third conductive layer and a source electrode and a drain electrode of the thin film transistor are in a same one layer.

15. The mother substrate according to claim 1, wherein
the first one-way conductive circuit comprises a diode; or the first one-way conductive circuit comprises a transistor, and a gate electrode of the transistor is electrically connected to a source electrode or a drain electrode of the transistor.

16. The mother substrate according to claim 1, wherein
an orthographic projection of the first sub-region on the mother substrate and an orthographic projection of the active layer on the mother substrate are at least partially overlapped with each other; and
an orthographic projection of the second sub-region on the mother substrate and the orthographic projection of the active layer on the mother substrate are not overlapped with each other.

17. A display panel including a display area, the display panel comprising: a plurality of first signal lines and a plurality of first one-way conductive circuits,
wherein the plurality of first signal lines extend from outside of the display area to the display area in parallel; and
the plurality of first one-way conductive circuits are respectively electrically connected to the plurality of first signal lines outside of the display area, and are configured to allow signals in each of the first signal lines to be capable of transmitting toward only one direction,
wherein the first one-way conductive circuit comprises a first conductive layer, a first insulation layer, an active layer, a second insulation layer, and a second conductive layer sequentially provided;
the first conductive layer comprises a first sub-region and a second sub-region which are insulated from each other; and
the second conductive layer comprises a first connection electrode and a second connection electrode which are insulated from each other, one end of the first connection electrode and one end of the second connection electrode are electrically connected to the first sub-region and the second sub-region respectively via through holes in the first insulation layer and the second insulation layer, and another end of the first connection electrode and another end of the second connection electrode are respectively electrically connected to the active layer.

18. The display panel according to claim 17, further comprising: a plurality of second signal lines being intersected with the plurality of first signal lines, and a plurality of second one-way conductive circuits,
wherein the plurality of second signal lines extend from the outside of the display area to the display area in parallel; and
the plurality of second one-way conductive circuits are respectively electrically connected to the plurality of second signal lines outside of the display area, and are configured to allow signals in each of the second signal lines to be capable of transmitting toward only one direction.

* * * * *